United States Patent
Lim et al.

(10) Patent No.: US 12,213,316 B2
(45) Date of Patent: Jan. 28, 2025

(54) SEMICONDUCTOR DEVICES AND DATA STORAGE SYSTEMS INCLUDING THE SAME

(71) Applicant: SAMSUNG ELECTRONICS CO., LTD., Suwon-si (KR)

(72) Inventors: Suhwan Lim, Hanam-si (KR); Nambin Kim, Seoul (KR); Samki Kim, Hwaseong-si (KR); Taehun Kim, Gwacheon-si (KR); Hanvit Yang, Suwon-si (KR); Changhee Lee, Hwaseong-si (KR); Jaehun Jung, Seongnam-si (KR); Hyeongwon Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 469 days.

(21) Appl. No.: 17/720,376

(22) Filed: Apr. 14, 2022

(65) Prior Publication Data
US 2023/0035421 A1    Feb. 2, 2023

(30) Foreign Application Priority Data
Jul. 28, 2021    (KR) .................. 10-2021-0099093

(51) Int. Cl.
*H10B 43/27*    (2023.01)
*H10B 41/27*    (2023.01)
(Continued)

(52) U.S. Cl.
CPC ............ *H10B 43/27* (2023.02); *H10B 41/27* (2023.02); *H10B 41/35* (2023.02); *H10B 41/40* (2023.02); *H10B 43/35* (2023.02); *H10B 43/40* (2023.02)

(58) Field of Classification Search
None
See application file for complete search history.

(56) References Cited

U.S. PATENT DOCUMENTS 9,916,901 B1    3/2018  Saito et al.
2010/0244119 A1  9/2010  Fukuzumi et al.
(Continued)

FOREIGN PATENT DOCUMENTS

KR   10-2010-0106911 A   10/2010
KR   10-2012-0131653 A   12/2012
(Continued)

*Primary Examiner* — Cory W Eskridge
(74) *Attorney, Agent, or Firm* — Muir Patent Law, PLLC

(57) ABSTRACT

A semiconductor device includes a lower structure including a semiconductor substrate and circuit devices on the semiconductor substrate; a stack structure including interlayer insulating layers and gate electrodes alternating in a vertical direction; and a channel structure penetrating the stack structure. The channel structure includes a core insulating layer, a channel layer, a gate dielectric layer, and a channel pad. A portion of the channel pad overlaps an uppermost gate electrode among the gate electrodes in a horizontal direction. The channel pad includes a first pad layer and a second pad layer on the first pad layer. The second pad layer includes doped polysilicon that is doped with impurities and having N-type conductivity. The first pad layer includes at least one of an undoped polysilicon region and a doped polysilicon region having N-type conductivity and having an impurity concentration lower than an impurity concentration of the second pad layer.

20 Claims, 23 Drawing Sheets

(51) Int. Cl.
  *H10B 41/35*   (2023.01)
  *H10B 41/40*   (2023.01)
  *H10B 43/35*   (2023.01)
  *H10B 43/40*   (2023.01)

(56) References Cited

U.S. PATENT DOCUMENTS

| | | | |
|---|---|---|---|
| 2012/0299076 A1* | 11/2012 | Yoo | H01L 29/66833 |
| | | | 257/314 |
| 2013/0009229 A1 | 1/2013 | Lee et al. | |
| 2013/0032878 A1 | 2/2013 | Kim et al. | |
| 2013/0069152 A1 | 3/2013 | Lee et al. | |
| 2014/0227842 A1 | 8/2014 | Lee et al. | |
| 2016/0172368 A1 | 6/2016 | Pang et al. | |
| 2020/0381446 A1 | 12/2020 | Choi et al. | |
| 2021/0313427 A1* | 10/2021 | Kim | H01L 25/074 |
| 2022/0005826 A1* | 1/2022 | Lim | H10B 43/35 |
| 2022/0028889 A1* | 1/2022 | Choi | H10B 43/27 |

FOREIGN PATENT DOCUMENTS

| | | |
|---|---|---|
| KR | 10-2013-0015428 A | 2/2013 |
| KR | 10-2020-0137806 A | 12/2020 |

* cited by examiner

SEMICONDUCTOR DEVICES AND DATA STORAGE SYSTEMS INCLUDING THE SAME

CROSS TO REFERENCE TO RELATED APPLICATION

This application claims benefit of priority to Korean Patent Application No. 10-2021-0099093 filed on Jul. 28, 2021, in the Korean Intellectual Property Office, the disclosure of which is incorporated herein by reference in its entirety.

BACKGROUND

1. Field

Embodiments relate to a semiconductor device and a data storage system including the same.

2. Description of the Related Art

There has been demand for a semiconductor device which may store high-capacity data in a data storage system that uses data storage. Accordingly, a measure for increasing data storage capacity of a semiconductor device has been studied. For example, as one method of increasing data storage capacity of a semiconductor device, a semiconductor device including memory cells arranged three-dimensionally, instead of memory cells arranged two-dimensionally, has been studied.

SUMMARY

According to an embodiment, a semiconductor device includes a lower structure including a semiconductor substrate and circuit devices on the semiconductor substrate; a pattern structure disposed on the lower structure and including a lower pattern layer, an intermediate pattern layer on the lower pattern layer, and an upper pattern layer on the intermediate pattern layer; a stack structure including interlayer insulating layers and gate electrodes alternately stacked on the pattern structure in a vertical direction; a channel structure penetrating the stack structure and extending in the vertical direction; and a separation structure penetrating the stack structure in the vertical direction, separating the gate electrodes of the stack structure from each other, and extending in a first direction perpendicular to the vertical direction, wherein the channel structure includes a core insulating layer, a channel layer on a side surface of the core insulating layer, a gate dielectric layer extending to a region between the channel layer and the gate electrodes, and a channel pad in contact with the channel layer on the core insulating layer, wherein a portion of the channel pad overlaps an uppermost gate electrode among the gate electrodes in a horizontal direction, wherein the channel pad includes a first pad layer and a second pad layer on the first pad layer, wherein the first pad layer covers at least a side surface of the second pad layer and is in contact with the channel layer, wherein the second pad layer includes doped polysilicon that is doped with impurities and having N-type conductivity, and wherein the first pad layer includes at least one of an undoped polysilicon region and a doped polysilicon region having N-type conductivity and having an impurity concentration lower than an impurity concentration of the second pad layer.

According to an embodiment, a semiconductor device includes a pattern structure including a lower pattern layer, an intermediate pattern layer on the lower pattern layer, and an upper pattern layer on the intermediate pattern layer; a stack structure including interlayer insulating layers and gate electrodes alternately stacked on the pattern structure in a vertical direction; and a channel structure penetrating the stack structure and extending in the vertical direction, wherein the channel structure includes a core insulating layer, a channel layer on a side surface of the core insulating layer, a gate dielectric layer extending to a region between the channel layer and the gate electrodes, and a channel pad in contact with the channel layer on the core insulating layer, wherein a bottom surface of the channel pad is disposed at a level that is lower than a level of an upper surface of an uppermost gate electrode among the gate electrodes, wherein the channel pad includes a first pad layer and a second pad layer on the first pad layer, wherein an internal side surface of the first pad layer in contact with the second pad layer is inclined with respect to an external side surface of the first pad layer in contact with the channel layer at a level of a region overlapping at least the uppermost gate electrode in the horizontal direction, wherein the second pad layer includes doped polysilicon having N-type conductivity, and wherein the first pad layer includes a doped polysilicon region having N-type conductivity and having an impurity concentration lower than an impurity concentration of the second pad layer.

According to an embodiment, a data storage system includes a semiconductor storage device including a lower structure including a semiconductor substrate and circuit devices on the semiconductor substrate, an upper structure on the lower structure, and an input/output pad electrically connected to the circuit devices; and a controller electrically connected to the semiconductor storage device through the input/output pad and controlling the semiconductor storage device, wherein the upper structure includes a pattern structure disposed on the lower structure and including a lower pattern layer, an intermediate pattern layer on the lower pattern layer, and an upper pattern layer on the intermediate pattern layer, a stack structure including interlayer insulating layers and gate electrodes alternately stacked on the pattern structure in a vertical direction; and a channel structure penetrating the stack structure and extending in the vertical direction, wherein the channel structure includes a core insulating layer, a channel layer on a side surface of the core insulating layer, a gate dielectric layer extending to a region between the channel layer and the gate electrodes, and a channel pad in contact with the channel layer on the core insulating layer, wherein a portion of the channel pad overlaps an uppermost gate electrode among the gate electrodes in a horizontal direction, wherein the channel pad includes a first pad layer and a second pad layer on the first pad layer, wherein the first pad layer covers both side surfaces of the second pad layer opposing each other, wherein the first pad layer has a first side surface in contact with the channel layer and a second side surface in contact with the second pad layer, wherein a slope of the first side surface is different from a slope of the second side surface, wherein the second pad layer includes polysilicon doped with impurities having N-type conductivity, and wherein the first pad layer includes a polysilicon region having N-type conductivity and having an impurity concentration lower than an impurity concentration of the second pad layer.

BRIEF DESCRIPTION OF DRAWINGS

Features will become apparent to those of skill in the art by describing in detail example embodiments with reference to the attached drawings in which.

DETAILED DESCRIPTION

Figure 1:
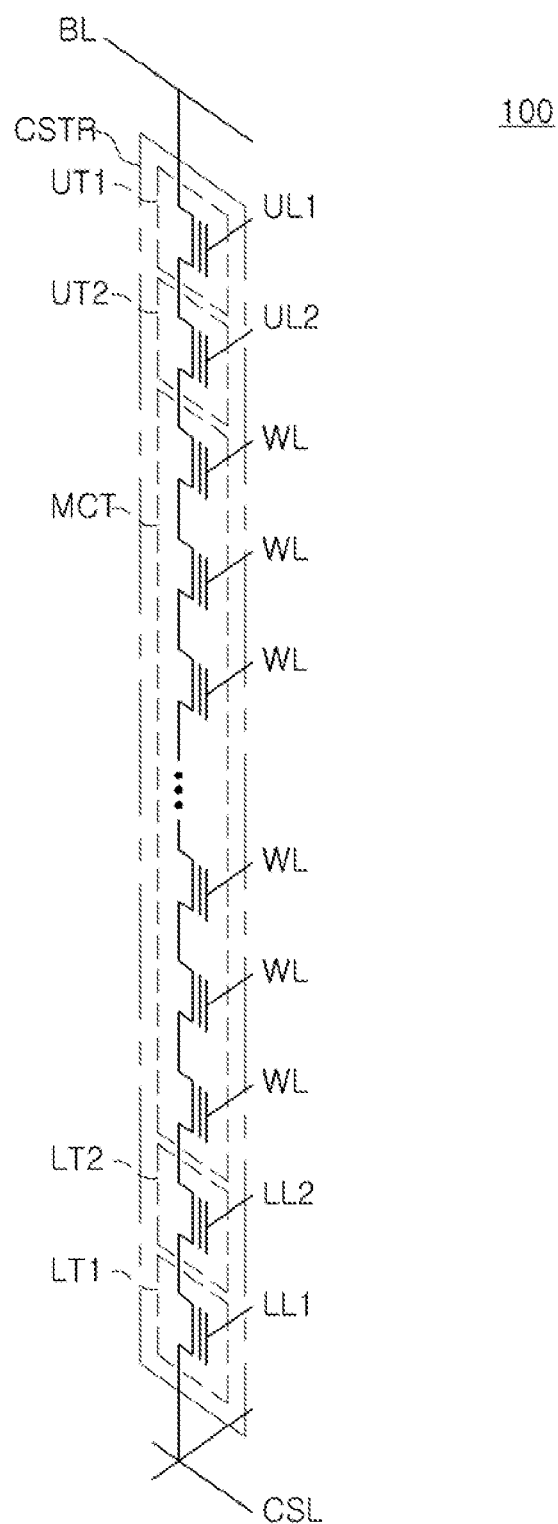
FIG. 1 is a circuit view illustrating a semiconductor device according to an example embodiment.

FIG. 1 is a circuit view illustrating a semiconductor device according to an example embodiment.

Referring to FIG. 1, a semiconductor device 100 may include a bit line BL, a common source line CSL, word lines WL, upper gate lines UL1 and UL2, lower gate lines LL1 and LL2, and a cell string CSTR disposed between the bit line BL and the common source line CSL.

The cell string CSTR may include one or a plurality of lower transistors LT1 and LT2 adjacent to the common source line CSL, one or a plurality of upper transistors UT1 and UT2 adjacent to the bit line BL, and a plurality of memory cell transistors MCT disposed between one or the plurality of lower transistors LT1 and LT2 and one or the plurality of upper transistors UT1 and UT2.

One or the plurality of lower transistors LT1 and LT2, the plurality of memory cell transistors MCT, and one or the plurality of upper transistors UT1 and UT2 may be connected in series.

In an example embodiment, the number of one or the plurality of upper transistors UT1 and UT2 may be two or more, and the plurality of upper transistors UT1 and UT2 may include a string select transistor UT2 and an upper erase control transistor UT1 connected to each other in series. The upper erase control transistor UT1 may be disposed on the string select transistor UT2.

In an example embodiment, the number of one or the plurality of lower transistors LT1 and LT2 may be two or more, and the plurality of lower transistors LT1 and LT2 may include a ground select transistor LT2 and a lower erase control transistor LT1 connected to each other in series. The lower erase control transistor LT1 may be disposed below the ground select transistor LT2.

The lower gate lines LL1 and LL2 may include a first lower gate line LL1 and a second lower gate line LL2. The upper gate lines UL1 and UL2 may include a first upper gate line UL1 and a second upper gate line UL2.

The first lower gate line LL1 may be configured as a gate electrode of the lower erase transistor LT1. The second lower gate line LL2 may be configured as a gate electrode of the ground select transistor LT2. The word lines WL may be configured as gate electrodes of the memory cell transistors MCT. The first upper gate line UL1 may be configured as a gate electrode of the upper erase transistor UT1. The second upper gate line UL2 may be configured as a gate electrode of the string select transistor UT2.

An erase operation for erasing data stored in the memory cell transistors MCT may use a gate induced drain leakage (GIDL) phenomenon occurring in the lower and upper erase transistors LT1 and UT1. During the erase operation of the semiconductor device 100 in the example embodiment, an erase voltage may be applied to the bit line BL, and a voltage smaller than the erase voltage may be applied to an erase control gate electrode of the upper erase transistor UT1 connected to the first upper gate line UL1. In this case, a depletion region may be formed in a portion in which the gate electrode of the upper erase transistor UT1 overlaps a drain region, and electron-hole pairs may be formed in the depletion region. In the formed electron-hole pairs, electrons may move toward the drain region by band-to-band tunneling (BTBT), and holes may move to the channel region such that the channel voltage may increase, thereby enabling the erase operation. The GIDL current may be defined as a current generated in the process described above and enabling the erase operation. The semiconductor device 100 in an example embodiment may intentionally generate a GIDL current in the erase operation. Holes from the electron-hole pairs generated while the GIDL current is generated may be implanted into channels of the memory cell transistors MCT. Accordingly, electrons trapped in a data storage layer of each of the memory cell transistors MCT may move by the intentionally generated GIDL current, or holes of a channel may be trapped in the data storage layer, such that the operation of erasing the data stored in the memory cell transistors MCT may be performed.

Figure 2:
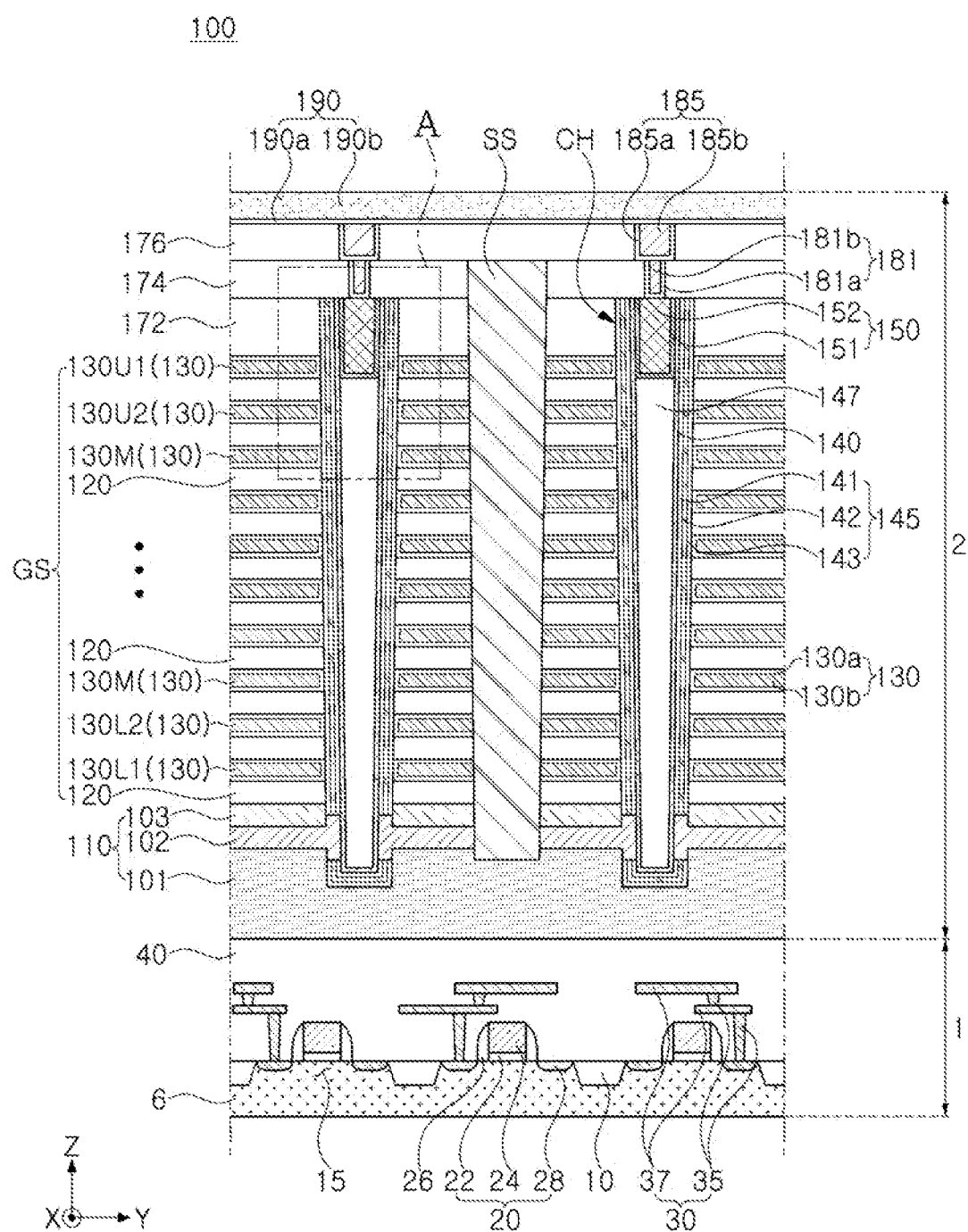
FIG. 2 is a cross-sectional view illustrating a semiconductor device according to an example embodiment.
Figure 3:
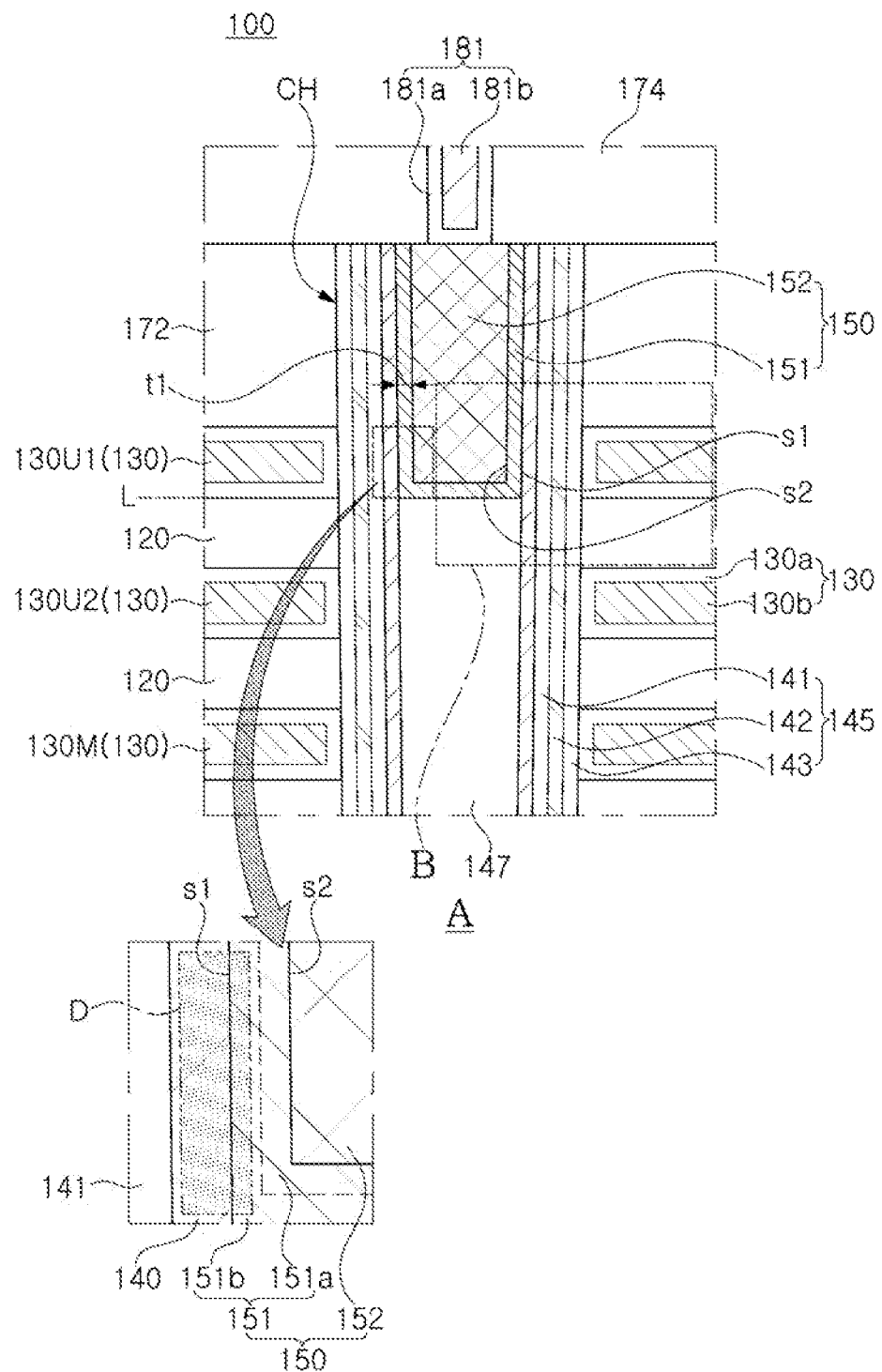
FIG. 3 is an enlarged view illustrating a portion of a semiconductor device according to an example embodiment.

FIG. 2 is a cross-sectional view illustrating a semiconductor device according to an example embodiment. FIG. 3 is an enlarged view illustrating a portion of a semiconductor device according to an example embodiment.

Referring to FIGS. 2 and 3, the semiconductor device 100 may include a lower structure 1, and an upper structure 2 on the lower structure 1.

The lower structure 1 may include a semiconductor substrate 6, circuit devices 20 disposed on the semiconductor substrate 6, a lower interconnection structure 30 electrically connected to the circuit devices 20, and a lower capping layer 40. The circuit devices 20 may be provided for operating a cell array of a NAND flash memory device.

The upper structure 2 may include a pattern structure 110 on the lower structure 1, a stack structure GS including interlayer insulating layers 120 and gate electrodes 130 alternately stacked on the pattern structure 110, a channel structure CH penetrating the stack structure GS, and a separation structure SS penetrating the stack structure GS and extending in one direction. The upper structure 2 may further include an upper capping layer 172, upper insulating layers 174 and 176, contact plugs 181 and 185 connected to the channel structure CH, and a bit line 190 disposed on the contact plugs 181 and 185. The upper structure 2 may include a region in which the cell array of the NAND flash memory device is disposed.

The semiconductor substrate 6 may include a semiconductor material, such as a group IV semiconductor, a group III-V compound semiconductor, or a group II-VI compound semiconductor. For example, the group IV semiconductor may include silicon (Si), germanium (Ge), or silicon-germanium (SiGe). The semiconductor substrate 6 may be configured as a single crystal silicon substrate. Device isolation layers 10 may be disposed in the semiconductor substrate 6, and source/drain regions 28 including impurities may be disposed in a portion of the active region 15 defined between the device isolation layers 10.

Each of the circuit devices 20 may include a transistor including a circuit gate dielectric layer 22, a circuit gate electrode 24, and source/drain regions 28. The source/drain regions 28 may be disposed on both sides of the circuit gate electrode 24 in the active region 15. The spacer layer 26 may be disposed on both sides of the circuit gate electrode 24, and may insulate the circuit gate electrode 24 and the source/drain region 28 from each other. The circuit gate dielectric layer 22 may include silicon oxide, silicon nitride, silicon oxynitride, or a high-k material. The circuit gate electrode 24 may include at least one of titanium nitride (TiN), tantalum nitride (TaN), and tungsten nitride (WN), titanium silicon nitride (TiSiN), tantalum silicon nitride (TaSiN), tungsten silicon nitride (WSiN), tungsten (W), copper (Cu), aluminum (Al), molybdenum (Mo), and ruthenium (Ru). The circuit gate electrode 24 may include a semiconductor layer, such as, e.g., a doped polycrystalline silicon layer, and may include a material layer such as a metal-semiconductor compound. In an example embodiment, the circuit gate electrode 24 may include two or more layers.

The lower interconnection structure 30 may be electrically connected to the circuit gate electrodes 24 of the circuit devices 20 and the source/drain regions 28. The lower interconnection structure 30 may include lower contact plugs 35 having a cylindrical shape or a truncated cone shape, and lower interconnection lines 37 having at least one region having a line shape. A portion of the lower contact plugs 35 may be connected to the source/drain regions 28, and although not illustrated, the other portion of the lower contact plugs 35 may be connected to the circuit gate electrodes 24. The lower contact plugs 35 may electrically connect the lower interconnection lines 37 disposed at different levels from an upper surface of the semiconductor substrate 6 to each other. The lower interconnection structure 30 may include a conductive material, and may include, e.g., tungsten (W), copper (Cu), aluminum (Al), and the like, and each component thereof may further include a diffusion barrier including titanium (Ti), titanium nitride (TiN), tantalum (Ta), tantalum nitride (TaN), and tungsten nitride (WN). In example embodiments, the number of the lower contact plugs 35 and lower interconnection lines 37 included in the lower interconnection structure 30 and the arrangements thereof may be varied.

At least a portion of the lower interconnection lines 37 may include a pad layer to which a plurality of through contact plugs extending downwardly from the upper structure 2 are directly connected (not shown in FIGS. 2 and 3). The plurality of through contact plugs may be disposed to penetrate a separate through region formed in the stack structure ST of the upper structure 2. The plurality of through contact plugs may be electrically connected to the gate electrodes 130 or the channel structures CH of the upper structure 2, respectively.

The lower capping layer 40 may be disposed to cover the semiconductor substrate 6, the circuit devices 20, and the lower interconnection structure 30. The lower capping layer 40 may be formed of a material such as silicon oxide, silicon nitride, silicon oxynitride, or silicon oxycarbide. The lower capping layer 40 may include a plurality of insulating layers. The lower capping layer 40 may include an etch stop layer formed of silicon nitride.

The pattern structure 110 may include a lower pattern layer 101, an intermediate pattern layer 102 on the lower pattern layer 101, and an upper pattern layer 103 on the intermediate pattern layer 102. At least a portion of the pattern structure 110 may correspond to the common source line CSL described with reference to FIG. 1.

The lower pattern layer 101 may include a semiconductor material such as polysilicon. The lower pattern layer 101 may include doped polysilicon. For example, the lower pattern layer 101 may include polysilicon including impurities having N-type conductivity. The impurities having N-type conductivity may include, e.g., at least one of phosphorus (P), arsenic (As), and antimony (Sb), which may be N-type dopants.

The intermediate pattern layer 102 may extend along an upper surface of the lower pattern layer 101. The intermediate pattern layer 102 and the upper pattern layer 103 may function as a portion of the common source line of the semiconductor device 100, and may function as a common source line together with the lower pattern layer 101, for example. The intermediate pattern layer 102 may penetrate the gate dielectric layer 145, and may be in contact with the channel layer 140. The intermediate pattern layer 102 and the upper pattern layer 103 may include a semiconductor material such as polysilicon. The intermediate pattern layer 102 may be a layer doped with impurities of the same conductivity as that of the lower pattern layer 101, and the upper pattern layer 103 may be configured as a doped layer or may include impurities diffused from the intermediate pattern layer 102. However, the material of the upper pattern layer 103 may be other than a semiconductor material, and may be formed of an insulating material.

The gate electrodes 130 may be stacked and spaced apart from each other in the vertical direction Z on the pattern structure 110, and may form a stack structure GS together with the interlayer insulating layers 120. The gate electrodes 130 may extend by different lengths on at least a region of the pattern structure 110.

The gate electrodes 130 may include at least one lower gate electrode, e.g., lower gate electrode 130L1 and lower gate electrode 130L2, at least one upper gate electrode, e.g., upper gate electrode 130U1 and upper gate electrode 130U2, and intermediate gate electrodes 130M disposed between the lower gate electrodes 130L1 and 130L2 and the upper gate electrodes 130U1 and 130U2. Storage capacity of the semiconductor device 100 may be determined depending on the number of intermediate gate electrodes 130M included in the memory cells.

Referring to the circuit view illustrating the semiconductor device 100 in FIG. 1 and FIGS. 2 and 3 together, the lower gate electrodes 130L1 and 130L2 may correspond to the lower gate lines LL1 and LL2, the upper gate electrodes 130U1 and 130U2 may correspond to the upper gate lines UL1 and UL2, and the intermediate gate electrodes 130M may correspond to the word lines WL.

The lower gate electrodes 130L1 and 130L2 may be a first lower gate electrode 130L1 and a second lower gate electrode 130L2. The first lower gate electrode 130L1 may be a gate electrode of the lower erase transistor LT1 described with reference to FIG. 1. The second lower gate electrode 130L2 may be a gate electrode of the ground select transistor LT2 described with reference to FIG. 1.

The upper gate electrodes 130U1 and 130U2 may be a first upper gate electrode 130U1 and a second upper gate electrode 130U2. The first upper gate electrode 130U1 may be a gate electrode of the upper erase transistor UT1 described with reference to FIG. 1. The second upper gate electrode 130U2 may be a gate electrode of the string select transistor UT2 described with reference to FIG. 1.

The first lower gate electrode 130L1 may be referred to as a "lowest gate electrode" or a "lower erase control gate electrode." The second lower gate electrode 130L2 may be referred to as a "second lower gate electrode" or a "ground select gate electrode." The first upper gate electrode 130U1 may be referred to as an "uppermost gate electrode" or an "upper erase control gate electrode." The second upper gate electrode 130U2 may be referred to as a "second upper gate electrode" or a "string select gate electrode." A thickness of the upper erase gate electrode 130U1 in the vertical direction Z may be in a range of about 20 nm to about 30 nm.

Each of the gate electrodes 130 may include a first gate layer 130a and a second gate layer 130b. The first gate layer 130a may include tungsten nitride (WN), tantalum nitride (TaN), titanium nitride (TiN), or a combination thereof. The second gate layer 130b may include a metal material, such as, e.g., tungsten (W). However, the configuration of the gate electrodes 130 may include, e.g., three or more layers, and may include polycrystalline silicon or a metal silicide material. The gate electrode in an example embodiment may include the first gate layer 130a and the second gate layer 130b. For example, the corresponding gate electrode 130 included in the upper erase control gate electrode 130U1 may include the first gate layer 130a and the second gate layer 130b corresponding thereto.

The interlayer insulating layers 120 may be disposed between the gate electrodes 130. Similarly to the gate electrodes 130, the interlayer insulating layers 120 may be stacked and spaced apart from each other in the vertical direction Z. The interlayer insulating layers 120 may include an insulating material such as silicon oxide, silicon nitride, or silicon oxynitride.

Each of the channel structures CH may form a single memory cell string, and may extend in the vertical direction Z perpendicular to the upper surface of the lower pattern layer 101. The channel structures CH may penetrate the stack structure GS in the vertical direction Z, and may be partially recessed into an upper portion of the lower pattern layer 101 from a lower end. The channel structures CH may be spaced apart from each other on the pattern structure 110 while forming rows and columns. For example, the channel structures CH may be disposed in a lattice pattern on a plane or in a zigzag pattern in one direction. Each of the channel structures CH may have a columnar shape having a side surface perpendicular to the upper surface of the lower pattern layer 101 or a side surface having a width decreasing toward the lower pattern layer 101 depending on an aspect ratio.

Each of the channel structures CH may include a channel layer 140, a gate dielectric layer 145, a core insulating layer 147, and a channel pad 150.

The gate dielectric layer 145 may include a tunneling layer 141, a data storage layer 142, and a blocking layer 143 stacked in order from the channel layer 140.

The channel layer 140 may be formed to have an annular shape surrounding the inner core insulating layer 147 in the channel structure CH, and may be disposed on the side surface of the core insulating layer 147. The channel layer 140 may cover a side surface and a bottom surface of the core insulating layer 147. The channel layer 140 may be in contact with the intermediate pattern layer 102 through an external side surface in a lower portion. The channel layer 140 may extend to a region between the upper erase gate electrode 130U1 and the channel pad 150. The channel layer 140 may include a semiconductor material such as polysilicon. For example, the channel layer 140 may include undoped polysilicon, and may be doped with impurities having P-type conductivity or impurities having N-type conductivity in example embodiments.

The gate dielectric layer 145 may be disposed between the gate electrodes 130 and the channel layer 140. A gate dielectric layer 145 may extend to a region between the gate electrodes 130 and the channel layer 140, may extend to a region above the upper erase control gate electrode 130U1, and may extend to a region below the lower erase control gate electrode 130L1. The tunneling layer 141 may tunnel charges into the data storage layer 142. The tunneling layer 141 may include, e.g., silicon oxide (SiO), silicon oxynitride (SiON), or a combination thereof. The data storage layer 142 may be configured as a charge trap layer. The data storage layer 142 may include, e.g., silicon nitride (SiN). The blocking layer 143 may include silicon oxide (SiO), silicon oxynitride (SiON), a high-k dielectric material, or a combination thereof.

The core insulating layer 147 may have a cylindrical shape extending in the vertical direction Z. An upper surface of the core insulating layer 147 may be in contact with the channel pad 150. The core insulating layer 147 may include silicon oxide or a low-k material.

The channel pad 150 may be disposed on the core insulating layer 147 in the channel structure CH. The channel pad 150 may be disposed on the internal side surface of the channel layer 140 and may be in contact with the channel layer 140. At least a portion of the channel pad 150 may be surrounded by the upper erase control gate electrode 130U1 in a horizontal direction parallel to the upper surface of the lower pattern layer 101. At least a portion of the channel pad 150 may overlap the upper erase control gate electrode 130U1 in the horizontal direction.

A level L of the bottom surface of the channel pad 150 may be lower than a level of the upper surface of the upper erase control gate electrode 130U1, and may be substantially the same as or higher than a level of the lower surface of the upper erase control gate electrode 130U1. The level L of the bottom surface of the channel pad 150 may be higher than a level of the upper surface of the string select gate electrode 130U2. In an example embodiment, the level L of the bottom surface of the channel pad 150 may be between the level of the lower surface of the upper erase control gate electrode 130U1 and the level of the upper surface of the string select gate electrode 130U2. The level L of the bottom surface of the channel pad 150 may be defined based on the surface of the lower pattern layer 101 facing the stack structure GS, such as, e.g., the upper surface of the lower pattern layer 101. The bottom surface of the channel pad 150 may include a downwardly curved portion, for example.

In an example embodiment, the channel pad 150 may include a first pad layer 151 and a second pad layer 152 on the first pad layer 151. The first pad layer 151 may cover side surfaces of the second pad layer 152 opposing each other. The first pad layer 151 may cover the lower surface of the second pad layer 152, and may have a U-shape or a shape similar thereto.

The first pad layer 151 may be formed of undoped (intentionally not doped) polysilicon, and may work as a diffusion buffer layer between the second pad layer 152 and the channel layer 140. For example, to form a depletion region D (described further below), the first pad layer 151 may intentionally diffuse impurities from the second pad layer 152 and may form a concentration gradient of impurities, thereby alleviating the diffusion of impurities. Thus, the first pad layer 151 may be provided to decrease the impurity concentration of a region adjacent to the channel layer 140 in the channel pad 150 to a predetermined value or less.

For example, referring to the inset in FIG. 3, the first pad layer 151 may include a first region 151a including a polysilicon region having a low concentration (formed by impurities diffused from the second pad layer 152 including impurities having a high concentration), and a second region 151b having impurities having a concentration lower than that of the first region 151a. At least a portion of the second region 151b may include an undoped polysilicon region. The first region 151a and the second region 151b may be divided based on whether the concentration of the N-type impurities corresponds to a predetermined value, such as, e.g., $2\times10^{19}/cm^3$. In the drawings, the vicinity corresponding to the predetermined concentration value is indicated by a dashed line between the interfacial surfaces s1 and s2. The concentration profile of impurities may be different from the illustrated example. The concentration distribution of impurities may be observed by X-ray fluorescence spectrometry (XRF) or secondary ion mass spectrometry (SIMS), for example.

In a region of the second region 151b horizontally overlapping the upper erase control gate electrode 130U1, the depletion region D may be formed adjacent to the interfacial surface s1 between the first pad layer 151 and the channel layer 140.

During an erase operation of the semiconductor device 100, electron-hole pairs may be formed in the depletion region D such that a gate induced drain leakage current may be induced.

In an example embodiment, the impurity concentration of the depletion region D may be, e.g., less than about $2\times10^{19}/cm^3$. However, the depletion region D may be defined upon a predetermined value different from this example.

The depletion region D may horizontally overlap the upper erase control gate electrode 130U1. Thus, the area in which the GIDL current is generated during the erase operation in the semiconductor device 100 in an example embodiment may increase further than in a case in which the channel pad 150 does not overlap the upper erase control gate electrode 130U1 in the horizontal direction. Also, the area in which the GIDL current is generated during an erase operation in the semiconductor device 100 in an example embodiment may increase further than in a case in which the first pad layer 151 is not included.

In further detail, in a case in which the channel pad 150 does not overlap the upper erase control gate electrode 130U1 in the horizontal direction, a GIDL current in which the vertical BTBT is dominant may be generated in the channel layer 140. In this case, since the area in which GIDL is generated may be locally formed in the channel layer 140, GIDL generation efficiency may be reduced. Also, in a case in which the first pad layer 151 is not included, the second pad layer 152 having a high concentration may be in direct contact with the channel layer 140, and accordingly, the area of the depletion region D in which the GIDL is generated may be relatively reduced, such that GIDL generation efficiency may be reduced. In the absence of the first pad layer 151, which may be the diffusion buffer layer, the depletion region D for generating the GIDL current may not be formed by a difference in impurity concentration.

On the other hand, in the present example embodiment, the channel pad 150 may overlap the upper erase control gate electrode 130U1 in the horizontal direction, such that the depletion region D may overlap the upper erase control gate electrode 130U1 in the horizontal direction. In this case, since the GIDL current may be generated in which transverse BTBT in the horizontal direction dominates, the area in which GIDL is generated may be increased by the overlap area. Also, in the present example embodiment, the first pad layer 151, as a diffusion buffer layer, is provided, and the area of the depletion region D may further increase. Accordingly, as the area of the depletion region D, the area in which GIDL is generated, increases, GIDL current generation efficiency may improve.

In general, to provide a PN junction between the channel pad 150 and the channel layer 140, GIDL generation efficiency may improve by doping impurities having P-type conductivity. However, in this case, since a dopant having P-type conductivity may need to be implanted in a concentration higher than that of the channel pad including impurities having N-type conductivity using an ion implantation process, the process cost may increase and mass productivity may degrade. Also, when the impurities having P-type conductivity are doped, an etch rate of the layer doped with the impurities having P-type conductivity may change. Accordingly, the doped region may be removed in a subsequent etching process, and it may be difficult to maintain the PN junction. Also, process dispersion in each of the channel structures CH may significantly increase due to the subsequent etching process.

On the other hand, in the present example embodiment, GIDL generation efficiency may improve using the first pad layer 151 working as a diffusion buffer layer and by providing the depletion region D. Thus, the process cost may be reduced by omitting an ion implantation process, and the process dispersion may not increase.

The area of the depletion region D and GIDL current generation efficiency therefrom may vary depending on a thickness t1 of the first pad layer 151 in the horizontal direction, which will be described in greater detail with reference to FIGS. 4A to 4D. Also, the area of the depletion region D and GIDL current generation efficiency therefrom may vary depending on the shape of the interfacial surface s2 between the first pad layer 151 and the second pad layer 152, which will be described in greater detail with reference to FIGS. 6 and 7.

The interfacial surfaces s1 and s2 between the channel layer 140, the first pad layer 151, and the second pad layer 152 may be distinguished from each other using energy dispersive spectroscopy (EDS), atom probe tomography (APT), or high-angle annular dark-field imaging (HAADF). For example, even when the channel layer 140, the first pad layer 151, and the second pad layer 152 are formed of the same material, the impurities may be locally concentrated and distributed on the interfacial surfaces s1 and s2 during the process, and accordingly, each layer may be distinguished from each other through the analysis method described above.

The second pad layer 152 may be disposed on the first pad layer 151. The second pad layer 152 may include doped polysilicon that is doped with impurities and having N-type conductivity. The concentration of impurities included in the second pad layer 152 may be, e.g., in a range of about $1\times10^{20}/cm^3$ to about $1\times10^{21}/cm^3$. The second pad layer 152 may be formed by directly depositing a doped semiconductor material. However, this may be varied, and after depositing the semiconductor material, the doping may be performed at a desired concentration through an additional process.

Referring again to FIG. 2, the separation structure SS may be disposed to penetrate the stack structure GS in the vertical direction Z, and may extend in the X direction. The separation structure SS may extend in the X direction and may separate the gate electrodes 130 of the stack structure GS from each other in the Y direction. A level of the upper surface of the separation structure SS may be higher than a level of the upper surface of the channel structure CH with respect to the upper surface of the lower pattern layer 101. The separation structure SS may penetrate the entire stacked gate electrodes 130, and may be in contact with the pattern structure 110. The separation structure SS may have a shape of which a width may decrease toward the lower pattern layer 101 due to a high aspect ratio. The separation structure SS may include an insulating material such as silicon oxide or silicon nitride. In an example embodiment, the separation structure SS may include an insulating spacer and a conductive layer in contact with the lower pattern layer 101.

The upper capping layer 172 may be disposed to cover upper portions of the stack structure GS and the channel structures CH. An upper surface of the upper capping layer 172 may be substantially coplanar with an upper surface of the channel structure CH. The upper capping layer 172 may be formed of a material such as silicon oxide, silicon nitride, silicon oxynitride, or silicon oxycarbide.

The upper insulating layers 174 and 176 may be disposed on the upper capping layer 172, and may include a first upper insulating layer 174 and a second upper insulating layer 176. The first upper insulating layer 174 may be substantially coplanar with the upper surface of the separation structure SS. The second upper insulating layer 176 may be disposed on the first upper insulating layer 174 and the separation structure SS. The upper insulating layers 174 and 176 may be formed of a material such as silicon oxide, silicon nitride, silicon oxynitride, or silicon oxycarbide.

The contact plugs 181 and 185 may be connected to the channel structures CH. The contact plugs 181 and 185 may include a first contact plug 181 and a second contact plug 185. The first contact plug 181 may be in contact with the channel pad 150. The contact plugs 181 and 185 may electrically connect the channel structure CH to the bit line 190. Each of the contact plugs 181 and 185 may include barrier layers 181a and 185a and conductive layers 181b and 185b. For example, the barrier layer 181a may surround a lower surface and side surfaces of the conductive layer 181b. The barrier layers 181a and 185a may include at least one of titanium (Ti), titanium nitride (TiN), tantalum (Ta), tantalum nitride (TaN), tungsten nitride (WN), and tungsten carbon nitride (WCN), for example. The conductive layers 181b and 185b may include a conductive material, a metal material such as tungsten (W), copper (Cu), or aluminum (Al), for example.

The bit line 190 may extend in the Y direction on the stack structure GS and the channel structures CH. The bit line 190 may be electrically connected to the circuit devices 20 of the lower structure 1 by through contact plugs. The bit line 190 may be electrically connected to the channel layer 140. The bit line 190 may include a barrier layer 190a and a conductive layer 190b. The barrier layer 190a may include at least one of titanium (Ti), titanium nitride (TiN), tantalum (Ta), tantalum nitride (TaN), tungsten nitride (WN), and tungsten carbon nitride (WCN), for example. The conductive layer 190b may include a conductive material, a metal material such as tungsten (W), copper (Cu), or aluminum (Al), for example. The bit line 190 illustrated in FIG. 2 may correspond to the bit line BL illustrated in the circuit view in FIG. 1.

Figure 4A:
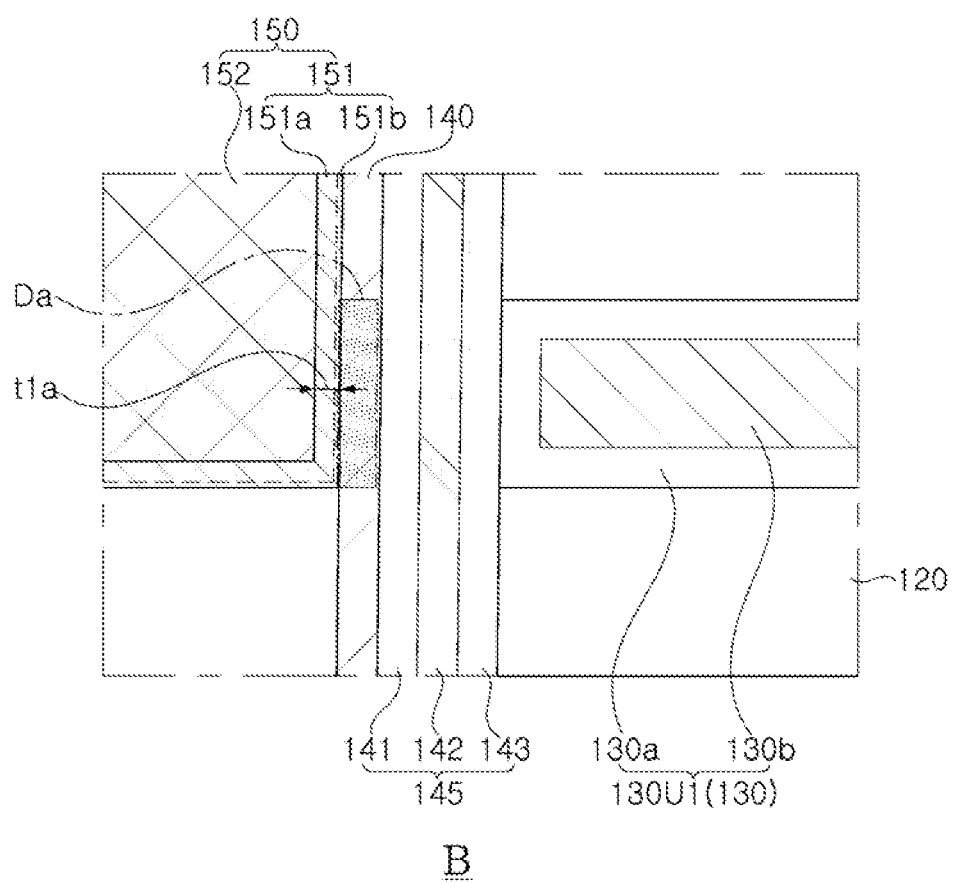
FIGS. 4A to 4C are views illustrating sizes of a depletion region, a GIDL generating region, in examples in which thicknesses of a first pad layer are different.
Figure 4B:
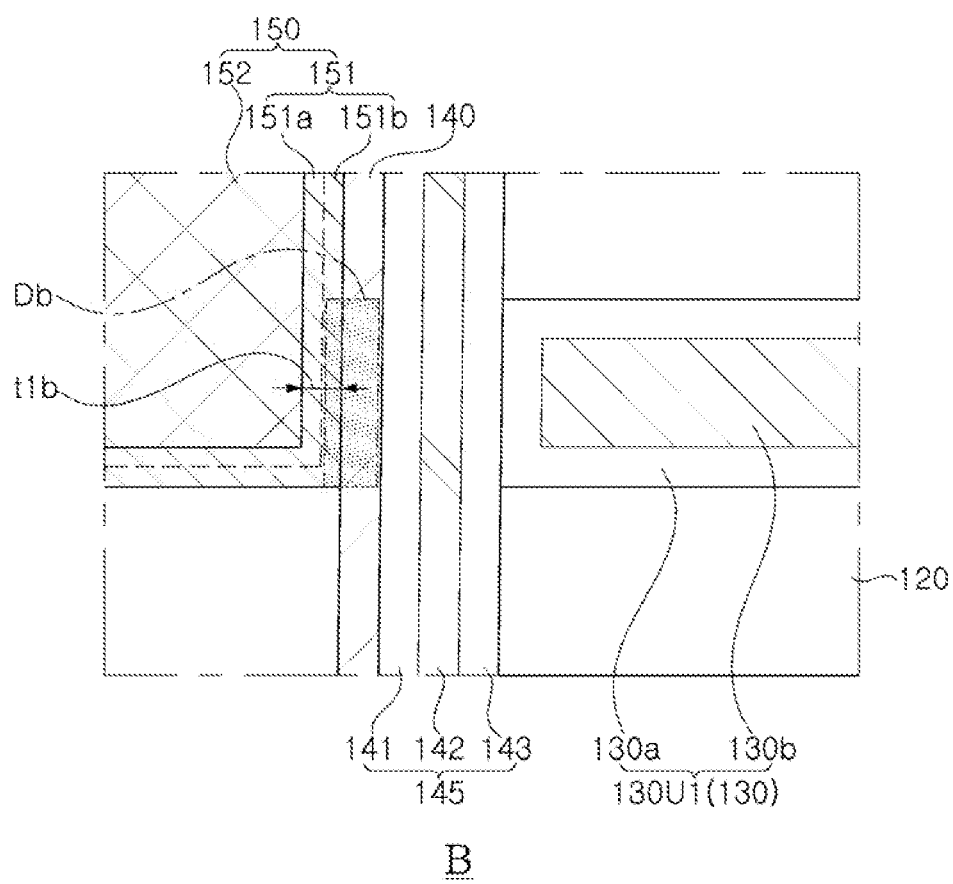
Figure 4C:
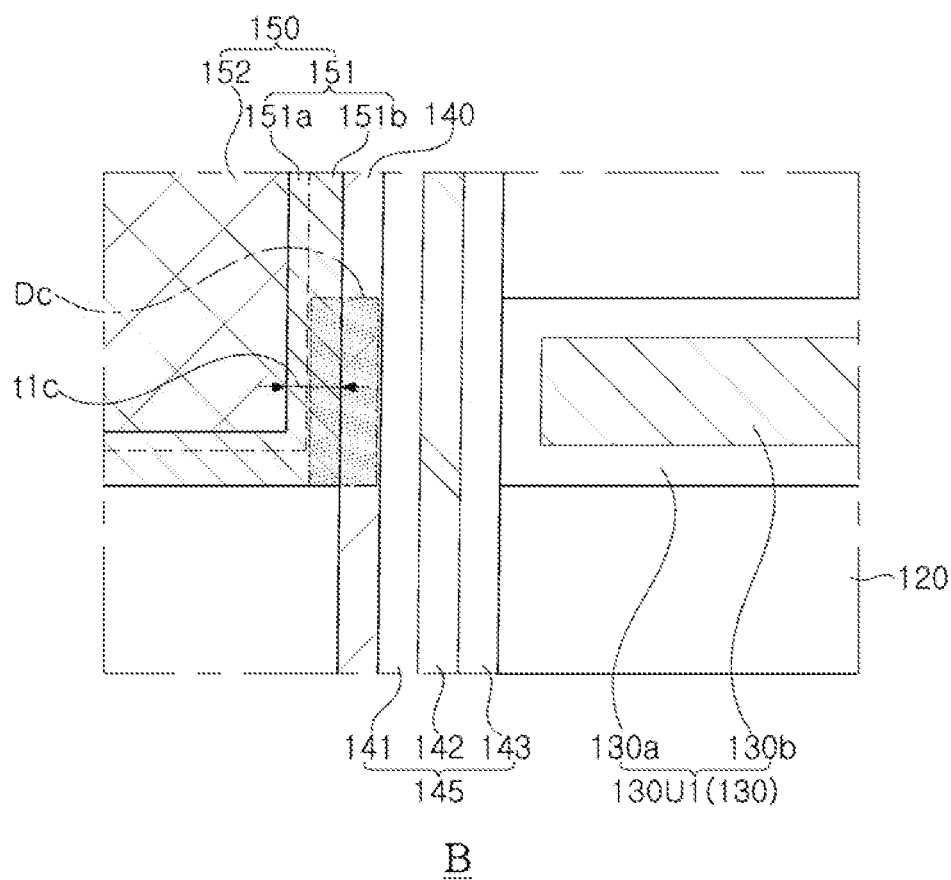

FIGS. 4A to 4C are views illustrating sizes of a depletion region, a GIDL generating region, in examples in which thicknesses of a first pad layer are different, and corresponding to region "B" in FIG. 3.

Referring to FIGS. 4A to 4C, as the thicknesses t1a, t1b, and t1c of the first pad layer 151 increase, the areas of the depletion regions Da, Db, and Dc may respectively increase.

Figure 4D:
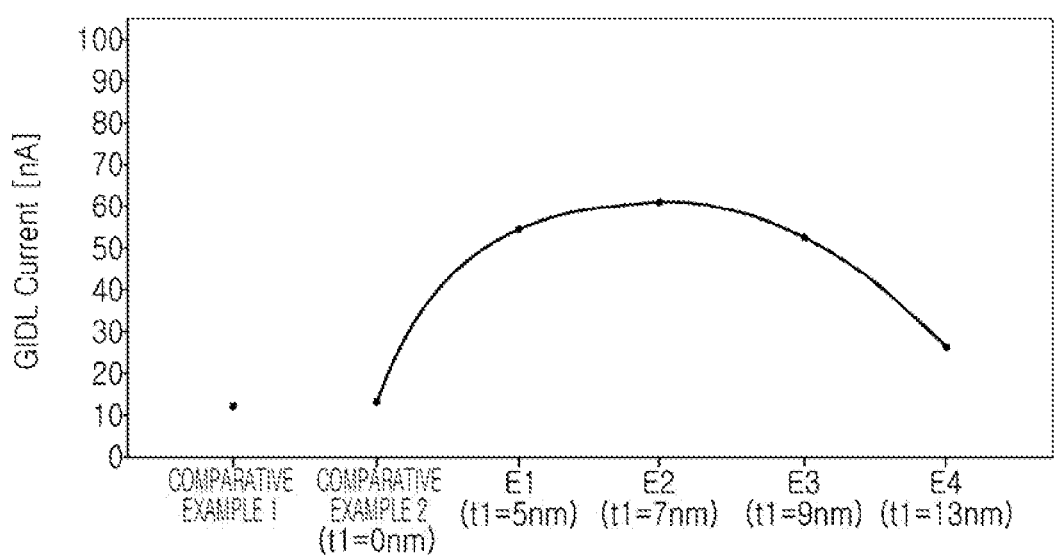
FIG. 4D is a graph illustrating a comparison of GIDL current values in comparative examples and example embodiments through simulation results.

The depletion regions Da, Db, and Dc may be internal regions indicated by dashed-dotted lines in the drawing. The GIDL current may be proportional to the area of the depletion region formed in the region in which the gate electrode and the drain region overlap each other. Accordingly, as the thicknesses t1a, t1b, and t1c of the first pad layer 151, which are diffusion buffer layers, increase, the corresponding areas Da, Db, and Dc may increase, such that the GIDL current may increase. However, the GIDL current may also be proportional to an electric field applied to the depletion region during the erase operation, and as the thicknesses t1a, t1b, and t1c increase, the applied electric field may decrease. Accordingly, when the first pad layer 151 is formed to have an optimal thickness in consideration of the area of the depletion region and the electric field, the generation of the GIDL current may increase. Referring to FIG. 4D together, when the thickness of the first pad layer 151 is in the range of about 3 nm to about 10 nm, the amount of GIDL current generation may significantly increase as compared to the comparative examples. Specifically, when the thickness of the first pad layer 151 is in the range of about 5 nm to about 9 nm, e.g., the amount of generated GIDL current may increase by about 4 times or more as compared to the comparative examples.

FIG. 4D is a graph illustrating comparison of GIDL current values in comparative examples and example embodiments through simulation results.

FIG. 4D illustrates GIDL current values generated during an erase operation in each example.

Comparative example 1 in FIG. 4D is an example in which an overlap region is not present, and comparative example 2 is an example in which the first pad layer 151 is not included (t1=0).

Example embodiments E1, E2, E3, and E4 in FIG. 4D indicate the GIDL current generated during the erase operation when the thickness t1 of the first pad layer 151 is varied in the range of about 5 nm to about 13 nm. The displayed GIDL current values may represent a median of samples in each example.

Referring to FIG. 4D, in the examples embodiments E1, E2, and E3, the amount of generated GIDL current increased by about 4 times or more relative to comparative examples 1 and 2. This may be because, as described above, by introducing the first pad layer 151 as a diffusion buffer layer, the depletion region D (in which a concentration of impurities is a predetermined concentration or less) was formed, and the area in which the GIDL was generated was increased by an area of overlap (where the depletion region D overlaps the erase control gate electrode 130U1 in the horizontal direction).

In comparative example 2, since the channel layer 140 has a small thickness of less than about 10 nm, specifically, about 5 nm, when the first pad layer 151 is not present, it may be difficult to form the depletion region for BTBT between the second pad layer 152 and the channel layer 140.

FIGS. 5 to 10 are enlarged views illustrating a portion of a semiconductor device according to an example embodiment, illustrating region "A" in FIG. 2.

Figure 5:
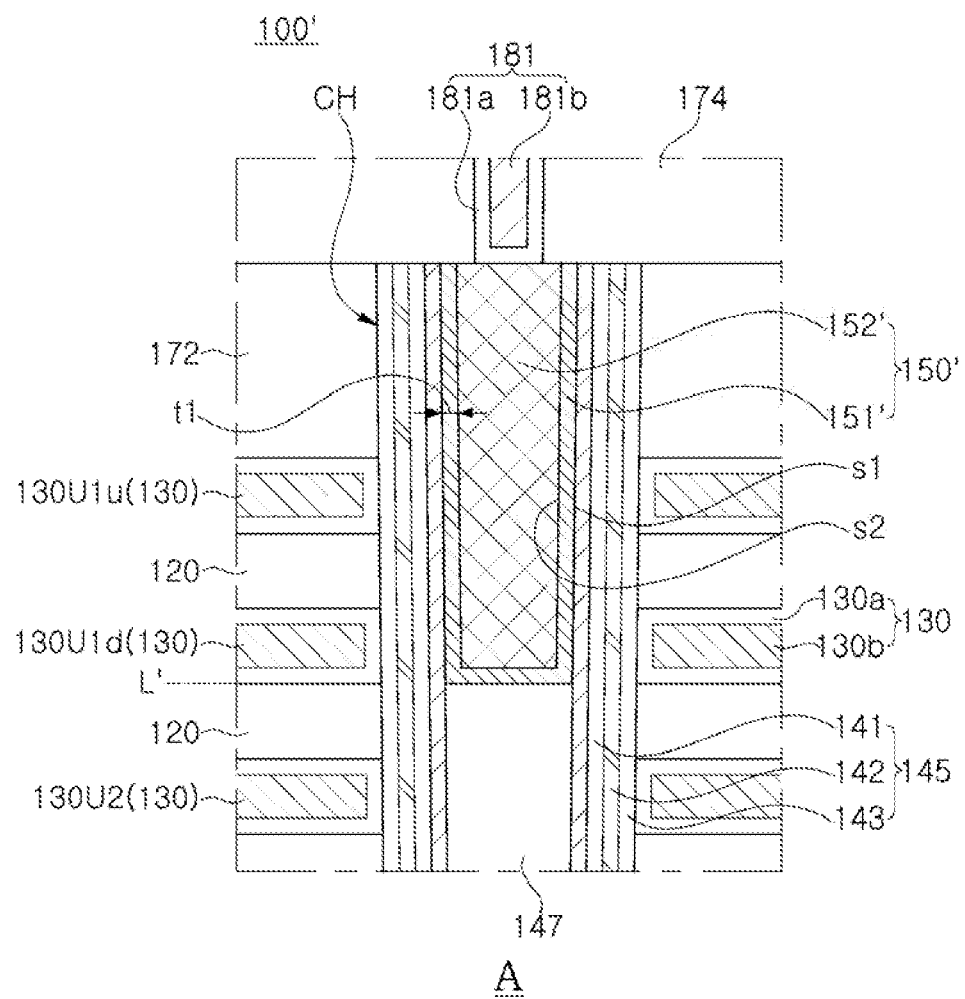
FIGS. 5 to 10 are enlarged views illustrating a portion of a semiconductor device according to an example embodiment.

Referring to FIG. 5, in a semiconductor device 100', two upper erase transistors may be disposed above a single cell string. For example, a first erase control gate electrode 130U1u (disposed on an uppermost end among the gate electrodes 130) and a second erase control gate electrode 130U1d (disposed below the first erase control gate electrode 130U1d) may be included in a first upper erase transistor and a second upper erase transistor, respectively. To improve efficiency of GIDL current generation, a level L' of a bottom surface of the channel pad 150' may be substantially equal to or higher than a level of a bottom surface of the second erase control gate electrode 130U1d. Accordingly, regions of the channel pad 150 may overlap the erase control gate electrodes 130U1u and 130U1d in the horizontal direction. Each of the first pad layer 151' and the second pad layer 152' may extend further downward than in the aforementioned example embodiment. However, in another example embodiment, a plurality of upper erase transistors may be disposed above a single cell string. For example, two or more upper erase control gate electrodes may be disposed and spaced apart from each other in the vertical direction Z on the string select gate electrode 130U2. When the number of upper erase control transistors increases, the area of the overlap region in which the channel pad 150' horizontally overlaps the upper erase control gate electrodes may increase, such that efficiency of GIDL current generation may increase.

Figure 6:
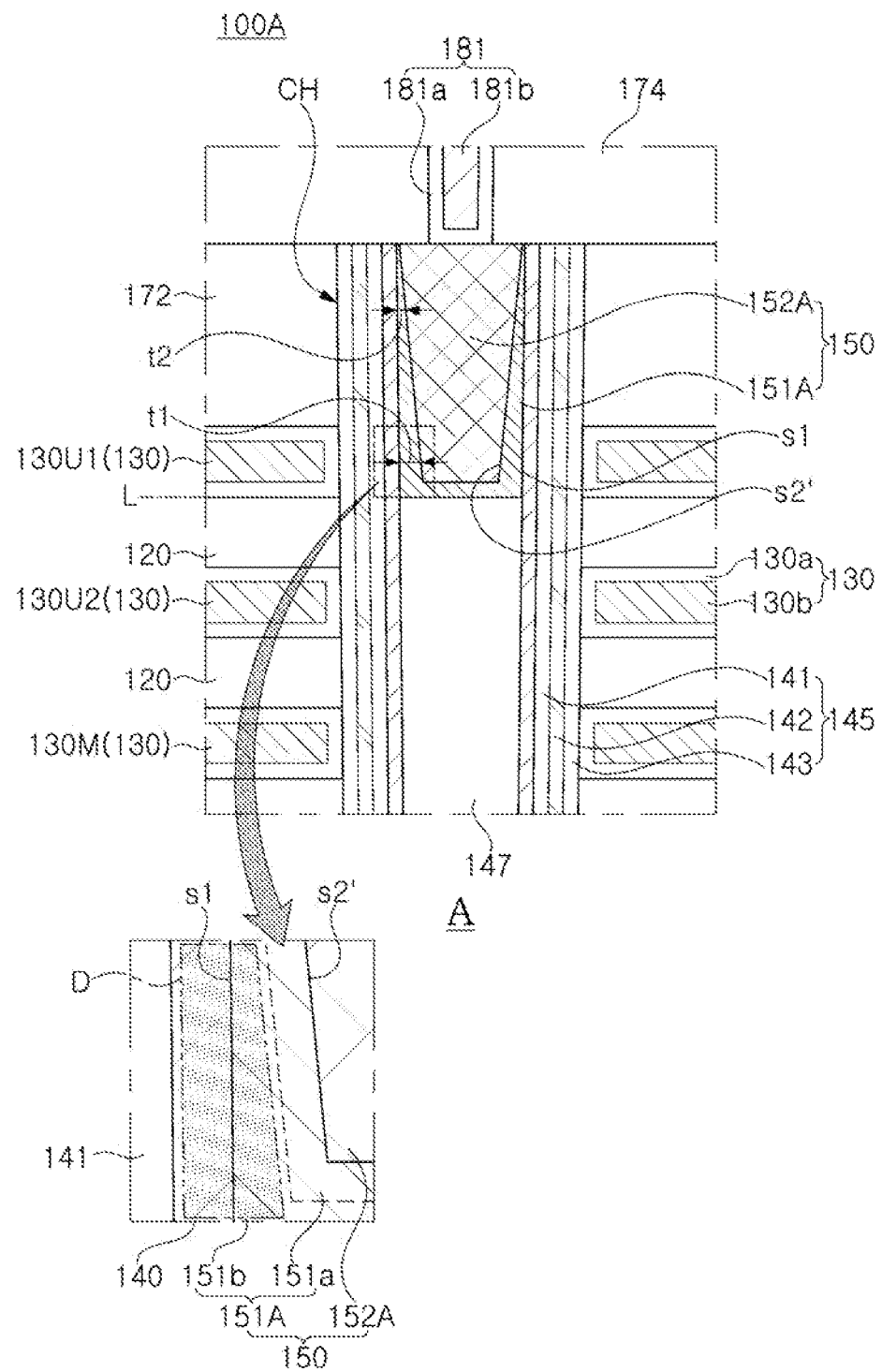

Referring to FIG. 6, in the semiconductor device 100A, a first pad layer 151A may be formed using a deposition-etch-deposition (DED) process, and the shape thereof may be different from the aforementioned example embodiment. For example, during the etching process, the upper portion of the first pad layer 151A may be removed relatively more than the other portions. The first pad layer 151A may include a portion in which a thickness in a horizontal direction decreases toward an upper end in a region in contact with the internal side surface of the channel layer 140. For example, the first pad layer 151A may include a lower portion and an upper portion on the lower portion, in a region in contact with the channel layer 140, and the lower portion may have a first thickness t1 in a horizontal direction, and the upper portion may have a second thickness t2 smaller than the first thickness t1 in the horizontal direction.

The internal side surface s2' of the first pad layer 151A in contact with a second pad layer 152A may be inclined with respect to the external side surface s1 of the first pad layer 151A in contact with the channel layer 140. The internal side surface s2' may be inclined less than the external side surface s1. The slope of the internal side surface s2' may be different from the slope of the external side surface s1. As the internal side surface s2' is inclined, the shape or area of the depletion region D may also vary. The area may increase in a lower portion of the depletion region D overlapping the upper erase gate electrode 130U1 in the horizontal direction, and an electric field applied during an erase operation may increase in an upper portion of the depletion region D. Thus, the shape of the depletion region D may be optimized such that generation of the GIDL current is maximized. Accordingly, efficiency of GIDL current generation may improve. A thickness in a region in which the first pad layer 151A overlaps the erase gate electrode 130U1 in the horizontal direction may be maintained in a range of about 3 nm to about 10 nm.

To correspond to the shape of the first pad layer 151A, the second pad layer 152A may have an inclined side surface, of which the thickness in the horizontal direction may decrease downwardly. As the first pad layer 151A has the inclined internal side surface s2', gap-filling of the second pad layer 152A filling the space therein may be easily performed in a subsequent process.

Figure 7:
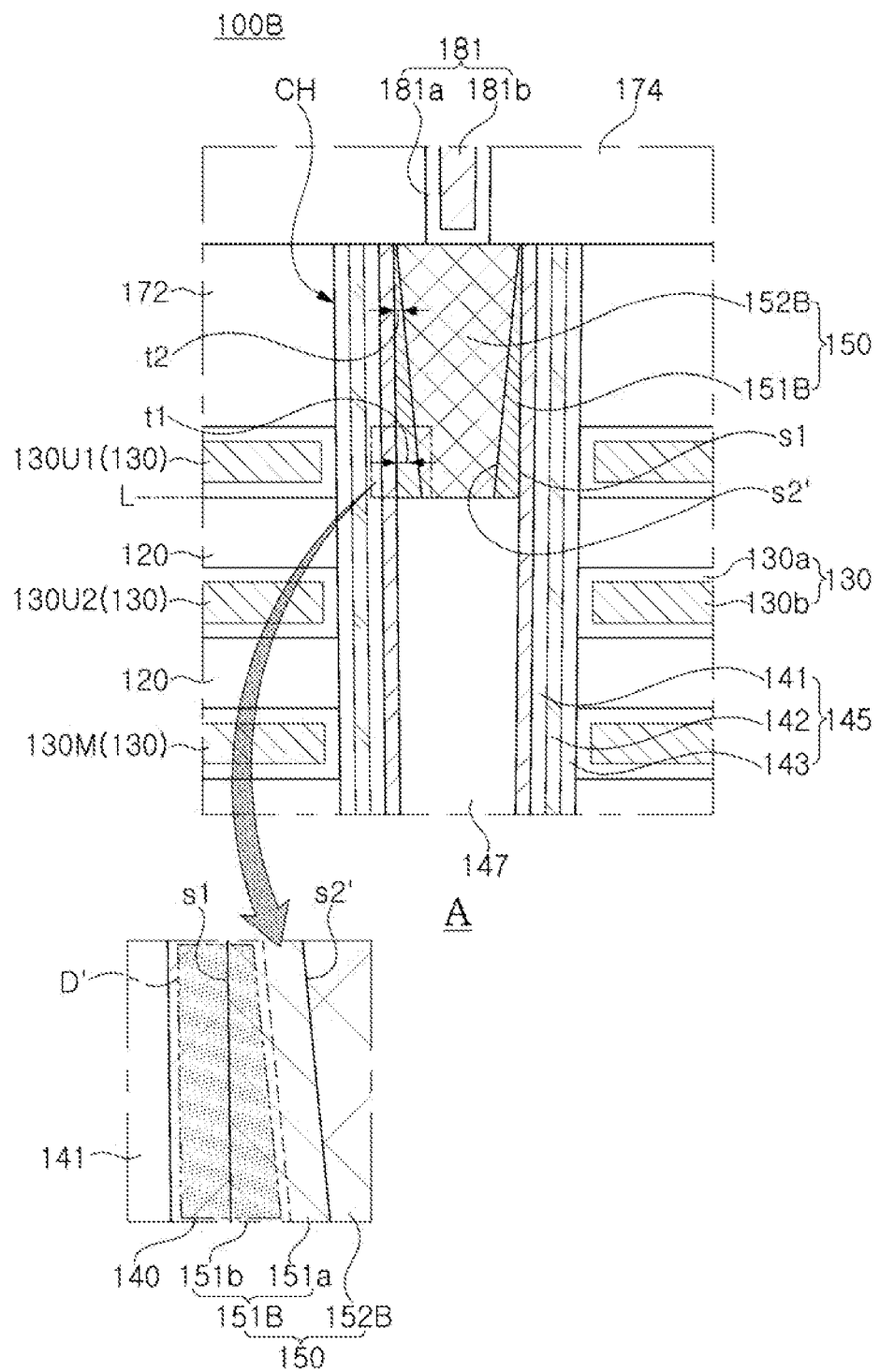

Referring to FIG. 7, in a semiconductor device 100B, similarly to the semiconductor device in FIG. 6, the internal side surface s2' of a first pad layer 151B may be inclined with respect to the external side surface s1. The second pad layer 152B may penetrate the first pad layer 151A, and the bottom surface of the second pad layer 152B may be in contact with the upper surface of the core insulating layer 147. A lower portion of the first pad layer 151B may be removed during an etching process.

Figure 8:
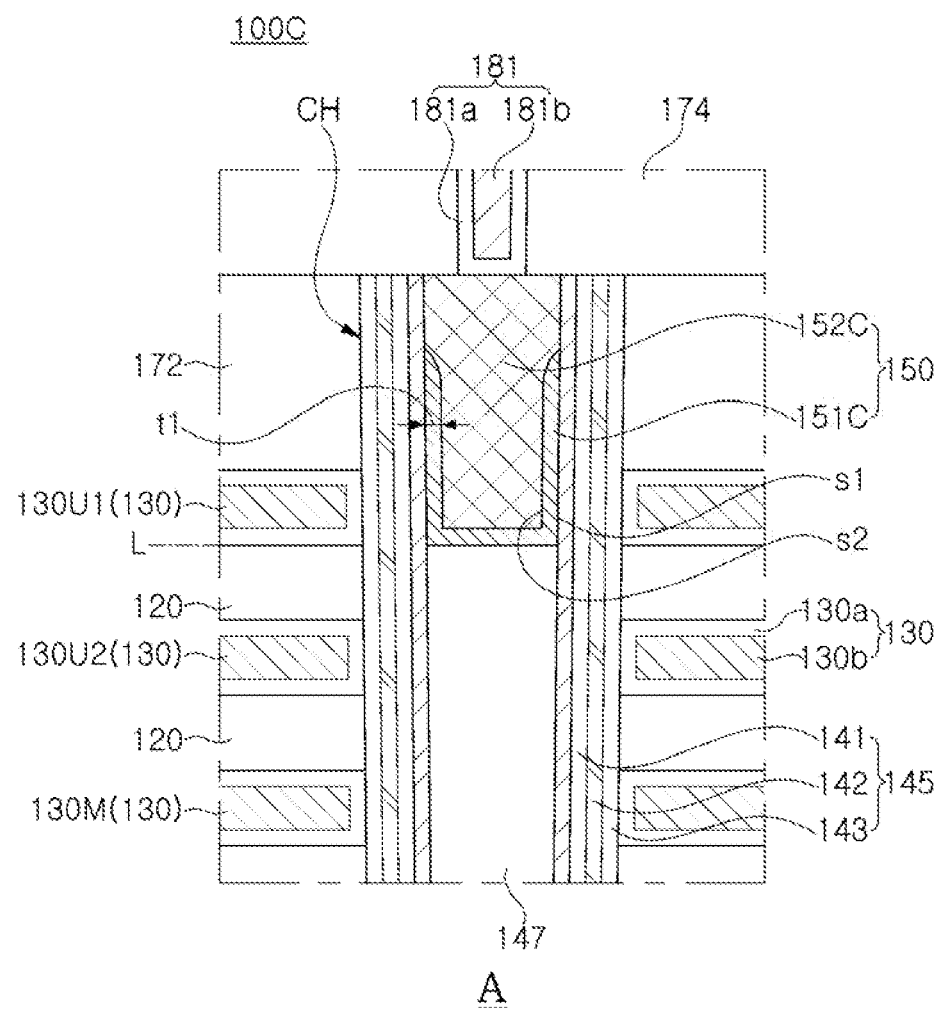

Referring to FIG. 8, in a semiconductor device 100C, an upper portion of a first pad layer 151C may be removed such that a second pad layer 152C may be in contact with the first pad layer 151C in a lower portion of a side surface, and may be in contact with the channel layer 140 in an upper portion of the side surface. For example, while the first pad layer 151C is removed by an etchback process, upper portions of the channel layer 140 and the gate dielectric layer 145 may also be partially removed.

Figure 9:
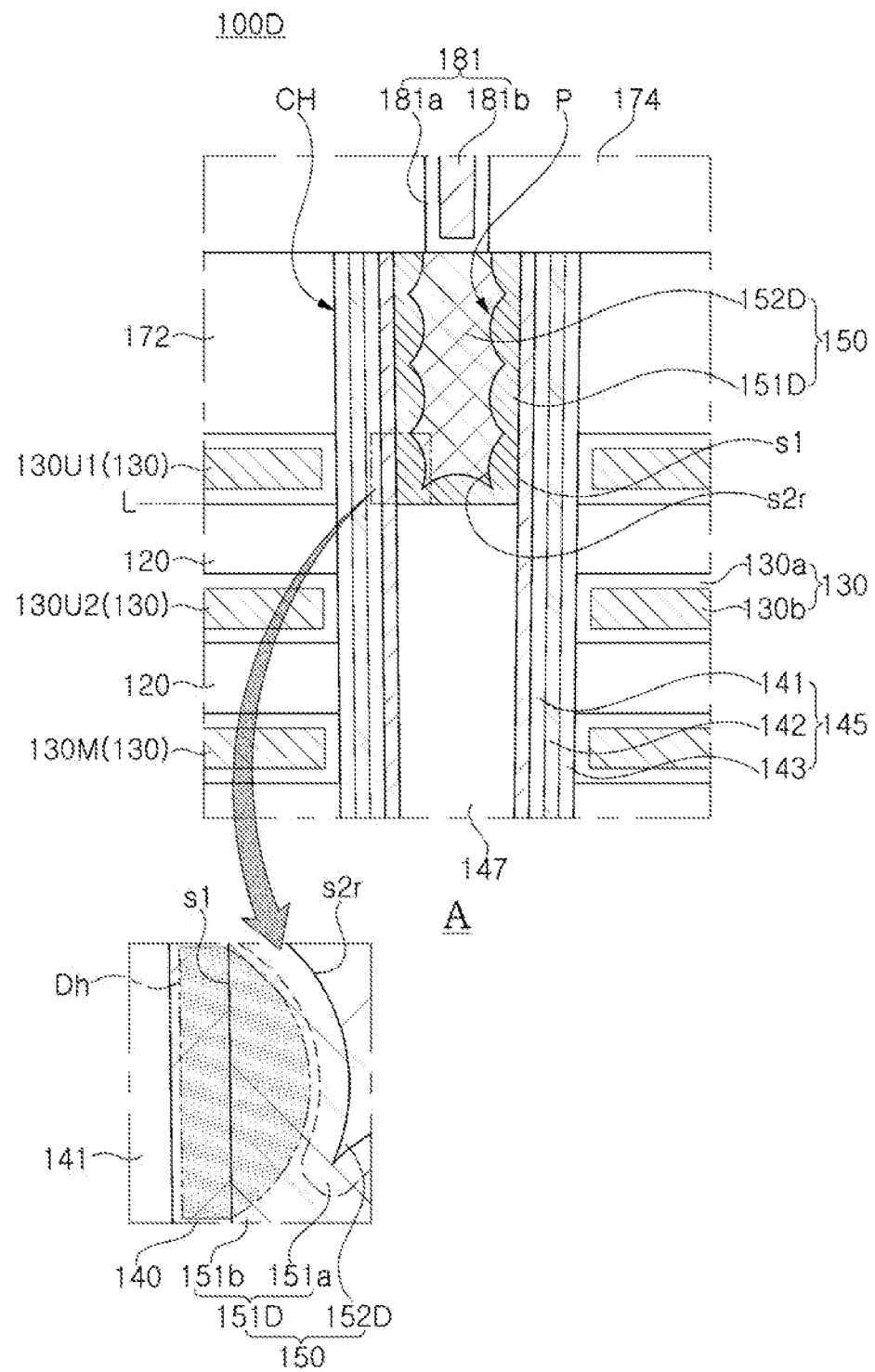

Referring to FIG. 9, in a semiconductor device 100D, a hemispherical grain (HSG) may be formed on the surface of a first pad layer 151D. For example, a curved protrusion P may be formed on an internal side surface s2r of the first pad layer 151D such that the first pad layer 151D may have serrations to include a serration portion. Accordingly, the surface area of the interfacial surface s2r between the first pad layer 151D and the second pad layer 152D may increase. The shape or area of the depletion region Dh may also vary in response to the internal side surface s2r having serrations. The area may increase in a middle region of the depletion region Dh overlapping the upper erase gate electrode 130U1 in the horizontal direction, and an electric field applied during an erase operation may increase in the upper and lower regions. The shape of the depletion region Dh may be optimized to increase GIDL current generation. Accordingly, efficiency of GIDL current generation may increase.

Figure 10:
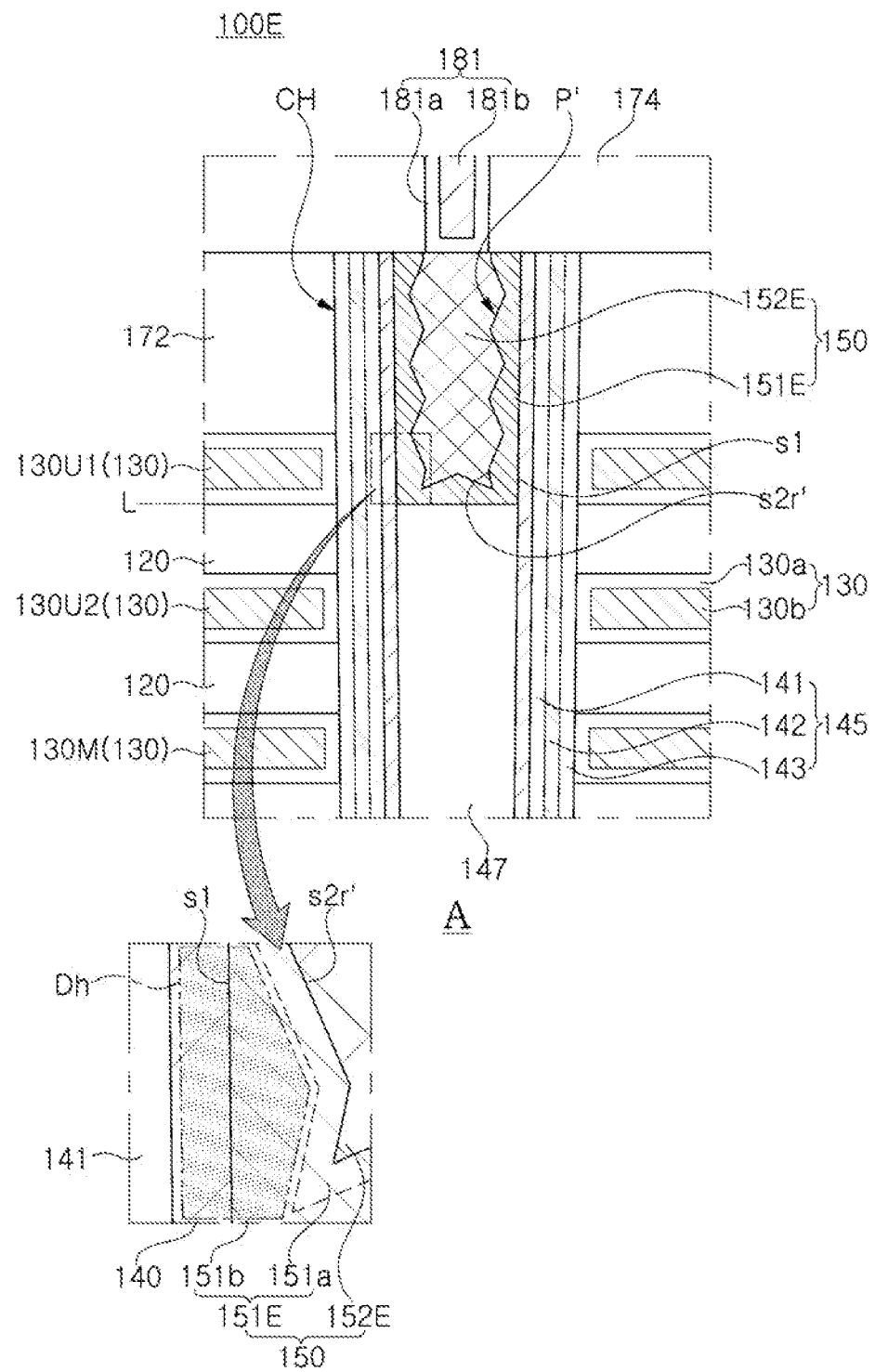

Referring to FIG. 10, in a semiconductor device 100E, HSG may be formed on the surface of a first pad layer 151E, and for example, a protrusion P' formed on an internal side surface s2r' of the first pad layer 151E may have an inwardly pointed shape. Accordingly, the surface area of the interfacial surface s2r' between the first pad layer 151E and a second pad layer 152E may increase. As described above, the shape of the depletion region Dh may be optimized to increase generation of the GIDL current. Accordingly, efficiency of GIDL current generation may improve.

Figure 11:
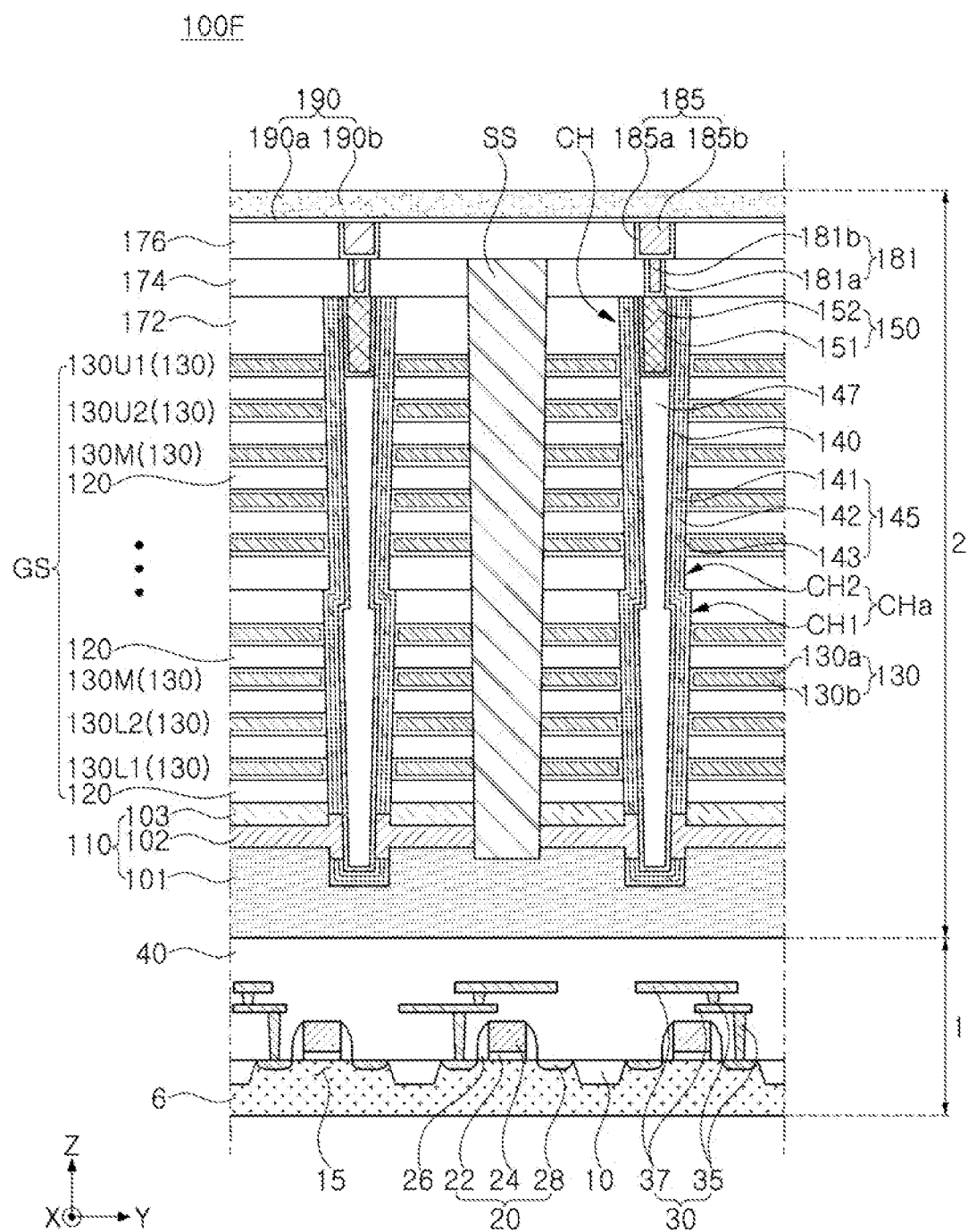
FIGS. 11 and 12 are cross-sectional views illustrating a semiconductor device according to an example embodiment.
Figure 12:
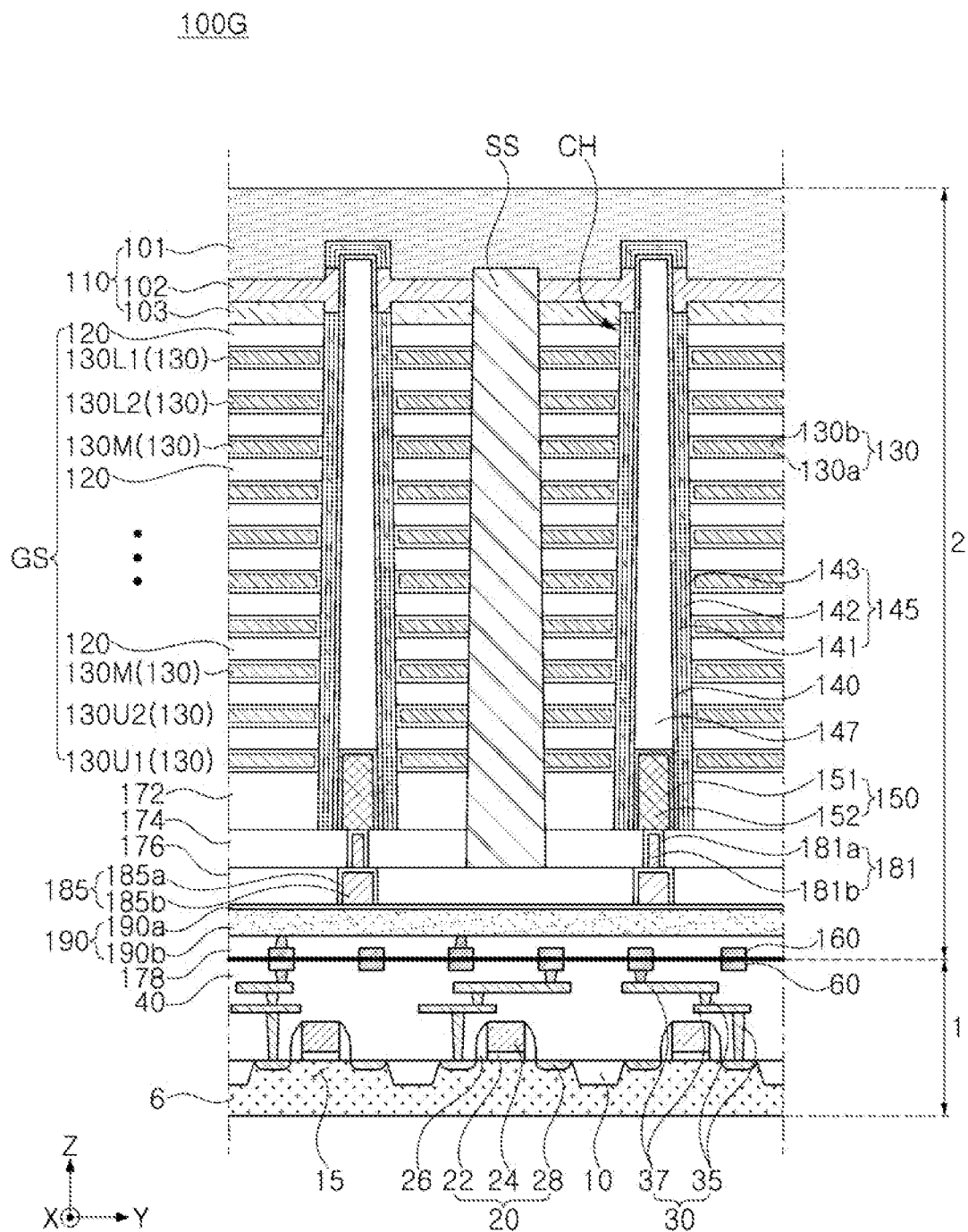

FIGS. 11 and 12 are cross-sectional views illustrating a semiconductor device according to an example embodiment, illustrating regions corresponding to FIG. 2.

Referring to FIG. 11, in a semiconductor device 100F, a stack structure GS of an upper structure 2 may include a lower stack structure and an upper stack structure on the lower stack structure, and each of a channel structures CHa may include a lower channel structure CH1 penetrating the lower stack structure and an upper channel structure CH2 penetrating the upper stack structure. The channel layer 140 of the first channel structure CH1 may be connected to the channel layer 140 of the second channel structure CH2. In the connection region, the gate dielectric layer 145 and the channel layer 140 may be bent. For example, the side surface of the channel layer 140 may include a bent portion formed by a difference in width in the connection region, and a slope of the side surface may change. In the example embodiment, the stack structure may be configured as a double stacked structure, and the example embodiment may also include an example embodiment in which the stack structure is configured as a multi-stack structure.

Referring to FIG. 12, in a semiconductor device 100G, a lower structure 1 and an upper structure 2 may be bonded to each other through a bonding structure. The upper structure 2 of the semiconductor device 100G may be obtained by disposing the upper structure 2 of the semiconductor device 100 in FIG. 2 upside down. The upper structure 2 may further include an upper bonding pad 160 and a lower bonding pad 60. The upper structure 2 may further include a third upper insulating layer 178. The upper bonding pad 160 may be electrically connected to the bit line 190 through a via, and the lower bonding pad 60 may be electrically connected to the circuit devices 20 through a via. The lower bonding pad 60 and the upper bonding pad 160 may include, e.g., tungsten (W), aluminum (Al), copper (Cu), tungsten nitride (WN), tantalum nitride (TaN), titanium nitride (TiN), or a combination thereof. The lower bonding pad 60 and the upper bonding pad 160 may function as a bonding layer for bonding the lower structure 1 to the upper structure 2. Also, the lower bonding pad 60 and the upper bonding pad 160 may provide an electrical connection path between the lower structure 1 and the upper structure 2. The lower bonding pad 60 and the upper bonding pad 160 may be bonded to each other by copper (Cu)-copper (Cu) bonding.

FIGS. 13 to 18 are views illustrating a method of manufacturing a semiconductor device according to an example embodiment, illustrating processes of a method of manufacturing a semiconductor device illustrated in FIG. 2 in order.

Figure 13:
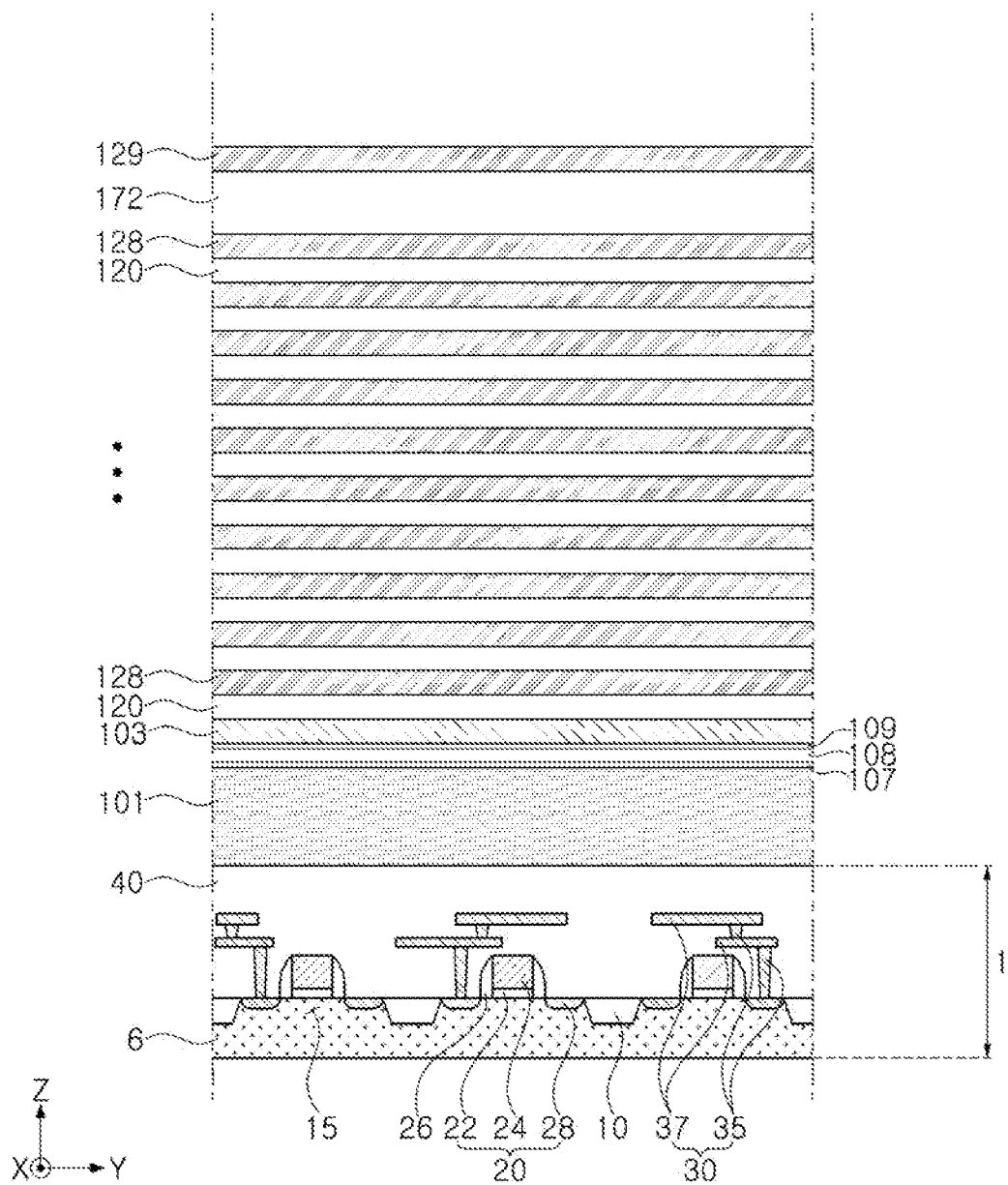
FIGS. 13 to 18 are views illustrating a method of manufacturing a semiconductor device according to an example embodiment.

Referring to FIG. 13, a lower structure 1 including circuit devices 20, a lower interconnection structure 30, and a lower capping layer 40 may be formed on a semiconductor substrate 6. A lower pattern layer 101, horizontal sacrificial layers 107, 108, and 109, and an upper pattern layer 103 may be formed on the lower structure 1. Interlayer insulating layers 120 and sacrificial layers 128 may be alternately stacked on the upper pattern layer 103.

Device isolation layers 10 may be formed in the semiconductor substrate 6. The circuit gate dielectric layer 22 and the circuit gate electrode 24 may be sequentially formed on the active region 15. The device isolation layers 10 may be formed by, e.g., a shallow trench isolation (STI) process. The circuit gate dielectric layer 22 may be formed of silicon oxide, and the circuit gate electrode 24 may be formed of at least one of polycrystalline silicon or a metal silicide layer. Thereafter, a spacer layer 26 may be formed on both sidewalls of the circuit gate dielectric layer 22 and the circuit gate electrode 24, and source/drain regions 28 may be formed in a portion of the active region 15. In example embodiments, the spacer layer 26 may include a plurality of layers. The source/drain regions 28 may be formed by performing an ion implantation process.

The lower contact plugs 35 and the lower interconnection lines 37 of the lower interconnection structure 30 may be formed by forming a portion of the lower capping layer 40, partially removing the lower capping layer 40 by etching, and filling a conductive material, or may be formed by depositing and patterning a conductive material, and filling the region removed by patterning with a portion of the lower capping layer 40.

The lower capping layer 40 may be formed of a plurality of insulating layers. A portion of the lower capping layer 40 may be formed in each process of forming the lower interconnection structure 30, and a portion of the lower capping layer 40 may be formed on the uppermost lower interconnection line 37, such that the lower capping layer 40 may be formed to cover the circuit devices 20 and the lower interconnection structure 30.

The lower pattern layer 101 may be formed on the lower structure 1, and may include a semiconductor material, such as, e.g., polysilicon.

The horizontal sacrificial layers 107, 108, and 109 may be stacked in order on the lower pattern layer 101. The horizontal sacrificial layers 107, 109, and 109 may include a first layer 107, a second layer 108, and a third layer 109, and may be replaced with the intermediate pattern layer 102 in FIG. 2 formed in a subsequent process. The first and third layers 107 and 109 may be formed of the same material as that of the interlayer insulating layers 120, and may be formed of, e.g., silicon oxide. The second layer 108 may be formed of the same material as that of the sacrificial layers 128 and may be formed of, e.g., silicon nitride.

The upper pattern layer 103 may be formed on the horizontal sacrificial layers 107, 108, and 109. Although not illustrated, the upper pattern layer 103 may include a portion in which the horizontal sacrificial layers 107, 108, and 109 are bent along a side surface of the patterned region and is in contact with the lower pattern layer 101. The upper pattern layer 103 may include a semiconductor material, such as, e.g., polysilicon.

The sacrificial layers 128 may be partially replaced with the gate electrodes 130 (see FIG. 2) in a subsequent process. The sacrificial layers 128 may be formed of a material different from that of the interlayer insulating layers 120, and may be formed of a material etched with etch selectivity for the interlayer insulating layers 120 under predetermined etching conditions. For example, the interlayer insulating layer 120 may be formed of at least one of silicon oxide and silicon nitride, and the sacrificial layers 128 may be formed of a material different from that of the interlayer insulating layer 120, selected from among silicon, silicon oxide, silicon carbide, and silicon nitride. In example embodiments, the thicknesses of the interlayer insulating layers 120 may not be the same. The thicknesses of the interlayer insulating layers 120 and the sacrificial layers 128 and the number of films included in the interlayer insulating layers 120 and the sacrificial layers 128 may be varied from the illustrated examples. An upper capping layer 172 and a stopper layer 129 may be formed on the uppermost sacrificial layer 128. The stopper layer 129 may include silicon nitride.

Figure 14:
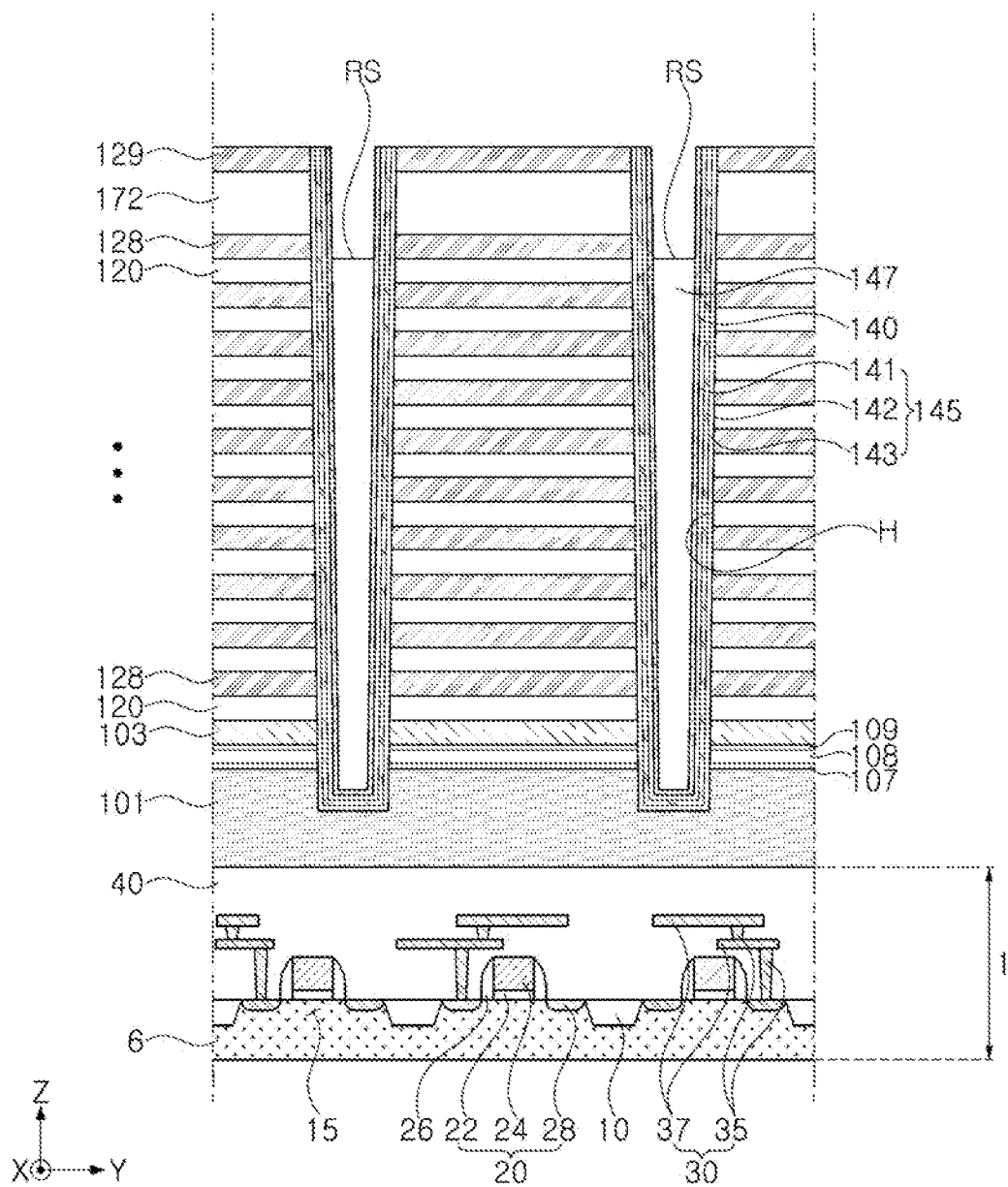

Referring to FIG. 14, a channel hole H penetrating the stack structure of the interlayer insulating layers 120 and the sacrificial layers 128 may be formed. The gate dielectric layer 145, the channel layer 140, and the core insulating layer 147 may be formed in the channel hole H. A recess portion RS may be formed by partially removing the core insulating layer 147 from an upper portion.

The channel hole H may be formed by anisotropically etching the stack structure of the interlayer insulating layers 120 and the sacrificial layers 128 in the vertical direction Z. The channel hole H may penetrate the upper capping layer 172, the stopper layer 129, the upper pattern layer 103, and the horizontal sacrificial layers 107, 108, and 109, and may be recessed into the lower pattern layer 101.

The gate dielectric layer 145 may be conformally formed in the channel hole H. The forming the gate dielectric layer 145 may include forming a blocking layer 143, a data storage layer 142, and a tunneling layer 141 in order from a sidewall of the channel hole H. Thereafter, the channel layer 140 may be conformally formed on the gate dielectric layer 145 in the channel hole H, and the core insulating layer 147 may be formed to fill the other space of the channel hole H. The gate dielectric layer 145 and the channel layer 140 may be formed to extend to the stopper layer 129 and may be removed by a planarization process. The exposed core insulating layer 147 may be partially removed from the upper portion, thereby forming the recess portion RS. The depth of the recess portion RS may be determined in consideration of the level of the bottom surface of the channel pad 150. For example, a lower end of the recess portion RS may be formed at a level that is lower than a level of the upper surface of the uppermost sacrificial layer 128, and may be formed at substantially the same level as or higher than a level of the lower surface of the uppermost sacrificial layer 128.

Figure 15:
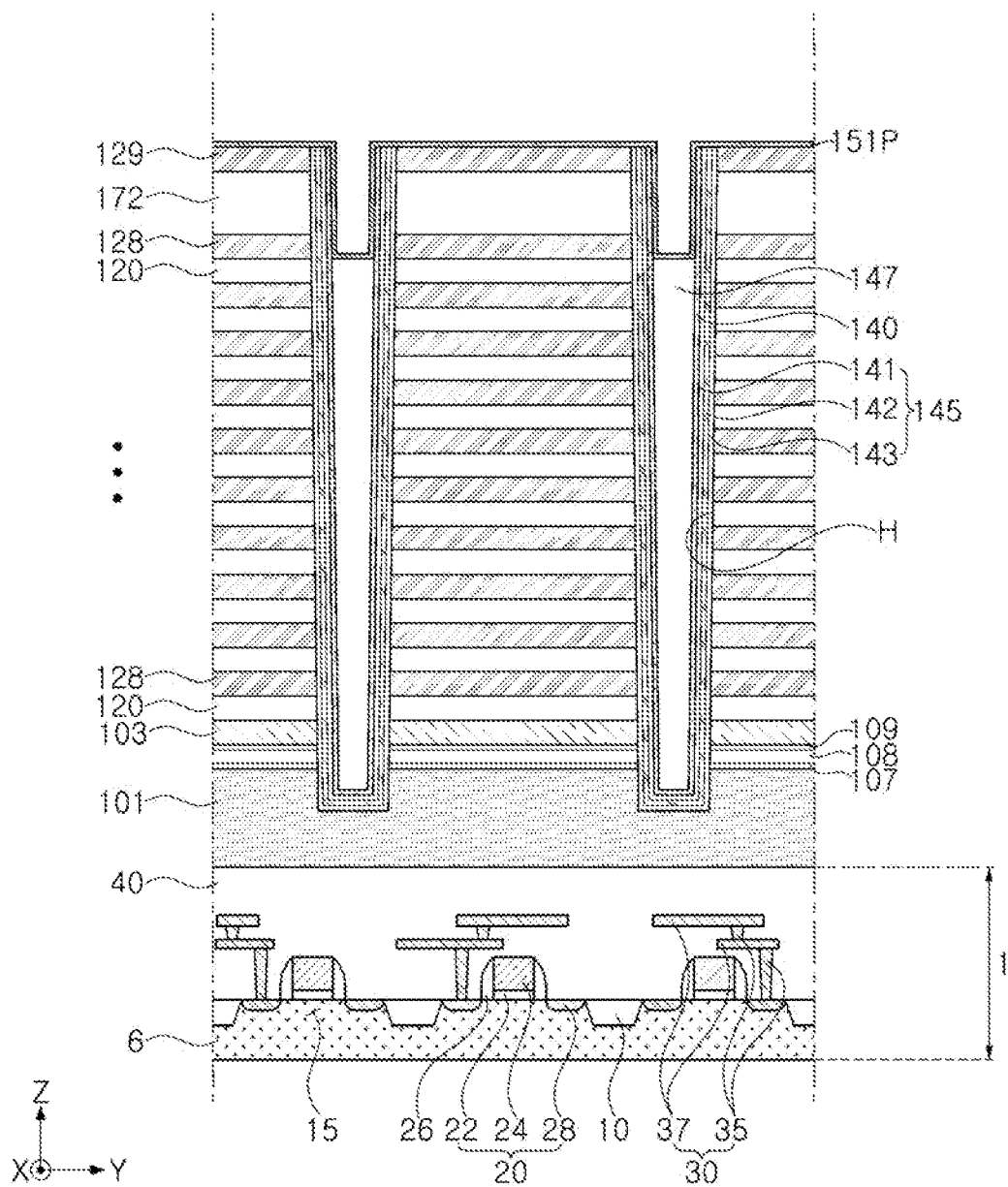

Referring to FIG. 15, an undoped polysilicon layer 151P may be formed.

The undoped polysilicon layer 151P may be conformally formed to cover the internal side surface of the channel layer 140 exposed by removing the core insulating layer 147 and the bottom surface of the recess portion RS. The undoped polysilicon layer 151P may extend to the stopper layer 129. In a subsequent process, the undoped polysilicon layer 151P may be partially removed by performing a DED process or an etchback process. For example, the undoped polysilicon layer 151P may be partially removed using an anisotropic etching process. In this process, the undoped polysilicon layer 151P may be partially removed and may remain only in the channel hole H to be included in the first pad layer 151 of the channel pad 150 in FIG. 2, and the shape and the thickness thereof may be varied depending on an etching process and a deposition process.

Figure 16:
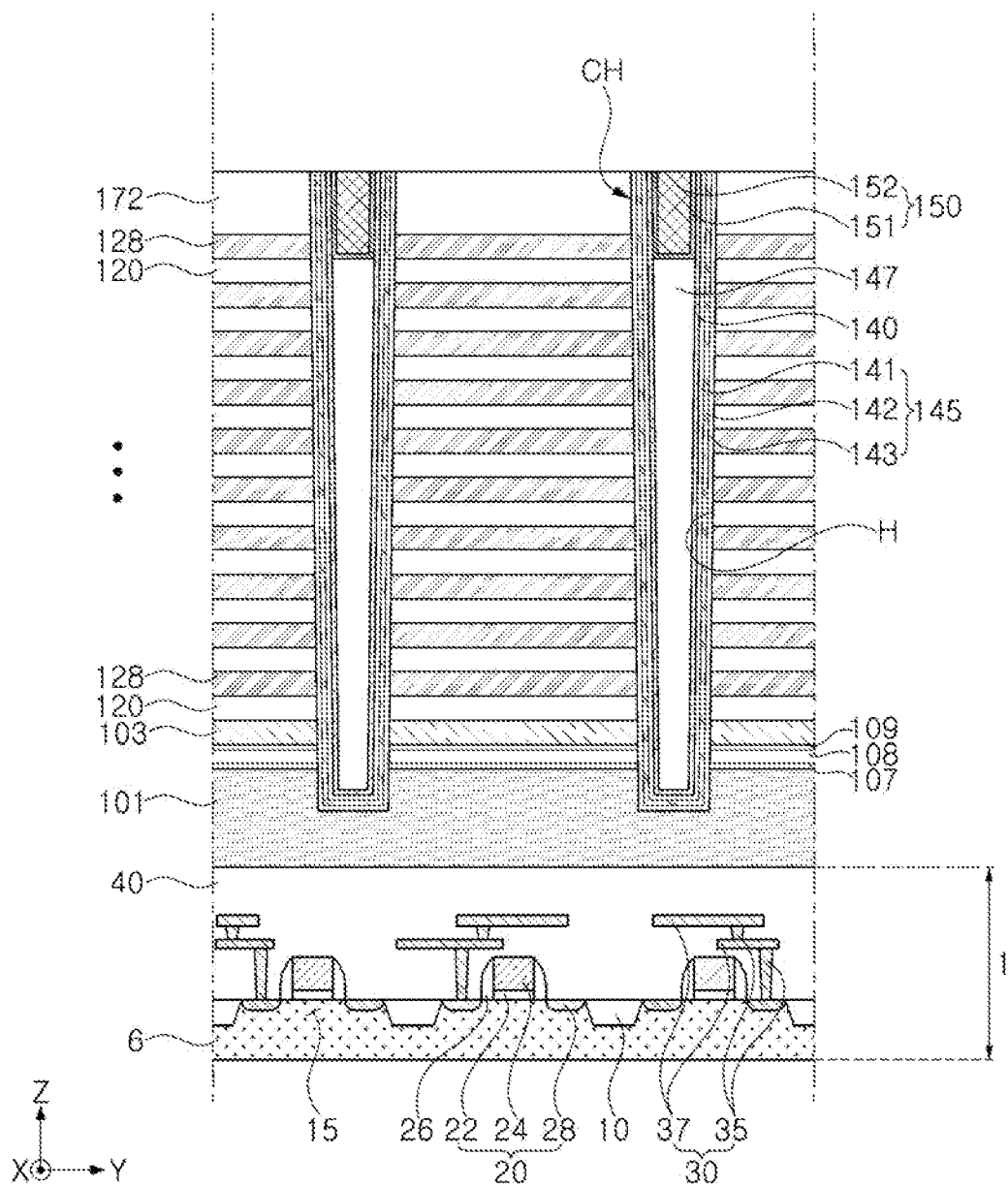

Referring to FIG. 16, the channel pad 150 may be formed by forming the second pad layer 152 on the first pad layer 151. Channel structures CH may be formed by performing a planarization process.

The second pad layer 152 may be formed to cover the first pad layer 151. The second pad layer 152 may be formed of polysilicon including impurities having N-type conductivity. In this process, an ion implantation process may not be performed when forming the channel pad. For example, to form PN bonding or to control the impurity concentration, a process of performing an ion implantation process on the channel pad may not be performed, and polysilicon doped with impurities having N-type conductivity may be directly deposited. In an example embodiment, since the first pad layer 151 may work as a diffusion buffer layer and impurities may be diffused from the second pad layer 152 such that a depletion region D may be formed, the impurity concentration of the depletion region D for generating the GIDL current may be controlled without the ion implantation process.

The planarization process may be performed until the upper surface of the upper capping layer 172 is exposed. While performing the planarization process, the stopper layer 129 may stop the planarization process. For example, while the stopper layer 129 is removed, when an interfacial surface between the different materials of the stopper layer 129 and the upper capping layer 172 is sensed, the planarization process may be stopped. Accordingly, the upper surface of the channel structure CH may be exposed, and the upper surface of the channel structure CH may be substantially coplanar with the upper surface of the upper capping layer 172. The planarization process may be, e.g., a chemical mechanical polishing process.

Figure 17:
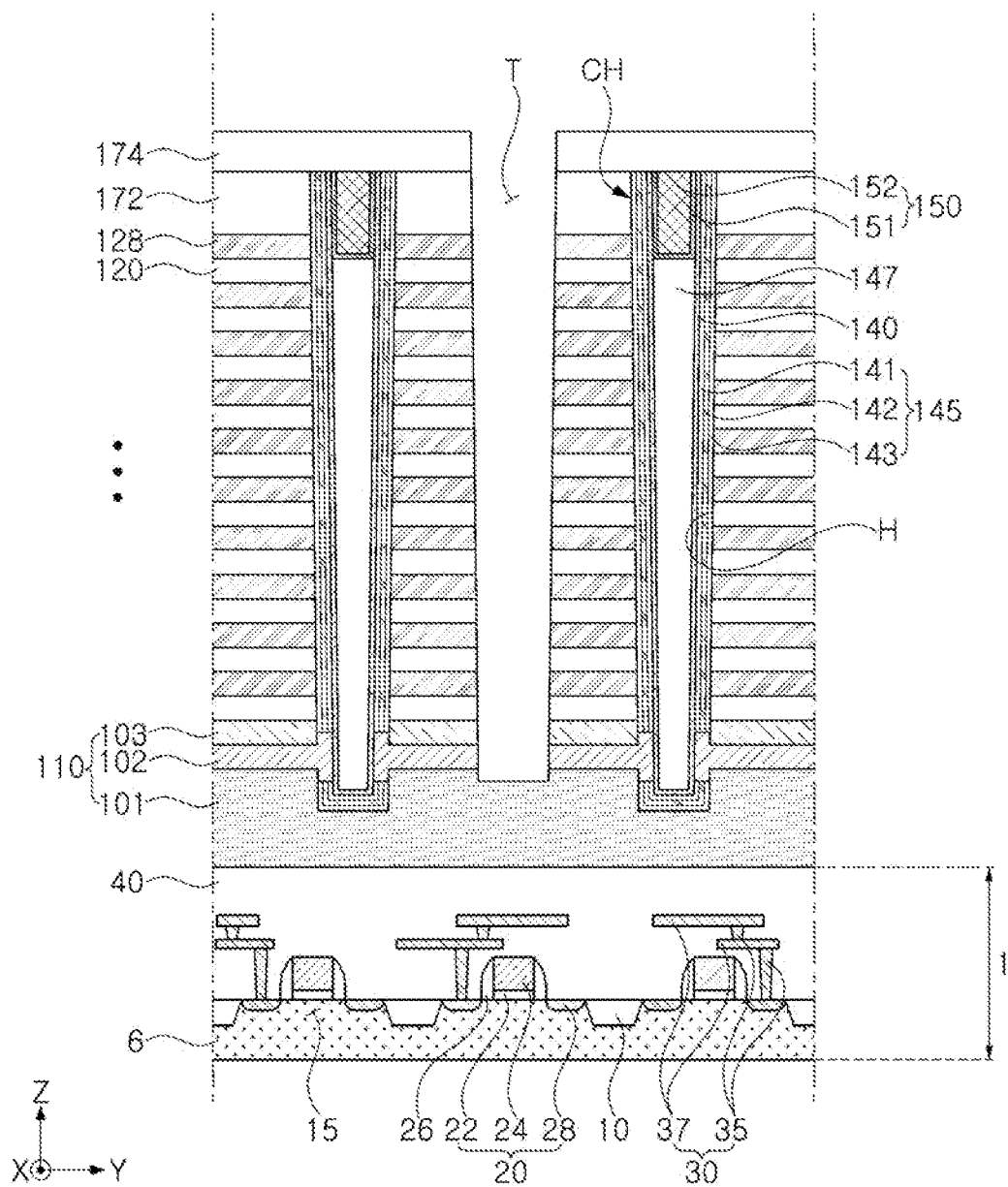

Referring to FIG. 17, an isolation trench T penetrating the stack structure of the upper pattern layer 103, the horizontal sacrificial layers 107, 108, and 109, the interlayer insulating layers 120, and the sacrificial layers 128 and extending in the X direction may be formed, and the horizontal sacrificial layers 107, 108, and 109 may be replaced with an intermediate pattern layer 102.

The isolation trench T may be formed by forming a mask layer using a photolithography process, and anisotropically etching the first upper insulating layer 174, the sacrificial layers 128, and the interlayer insulating layers 120. The isolation trench T may be formed in the form of a trench extending in the X direction, and may expose the lower pattern layer 101 on a lower end.

Thereafter, while forming other sacrificial spacer layers in the trench T, the second layer 108 may be exposed by an etchback process. The second layer 108 may be selectively removed, and the first and third layers 107 and 109 disposed above and below the second layer 108 may be removed. The trench T may be partially recessed into the lower pattern layer 101, and may penetrate the upper capping layer 172 and the first upper insulating layer 174.

The horizontal sacrificial layers 107, 108, and 109 may be removed by an etching process. During the process of removing the horizontal sacrificial layers 107, 108, and 109, a portion of the exposed gate dielectric layer 145 may also be removed from a side surface. The intermediate pattern layer 102 may be formed by depositing a conductive material in the region from which the horizontal sacrificial layers 107, 108, and 109 are removed, the sacrificial spacer layers may be removed from the trench T.

Figure 18:
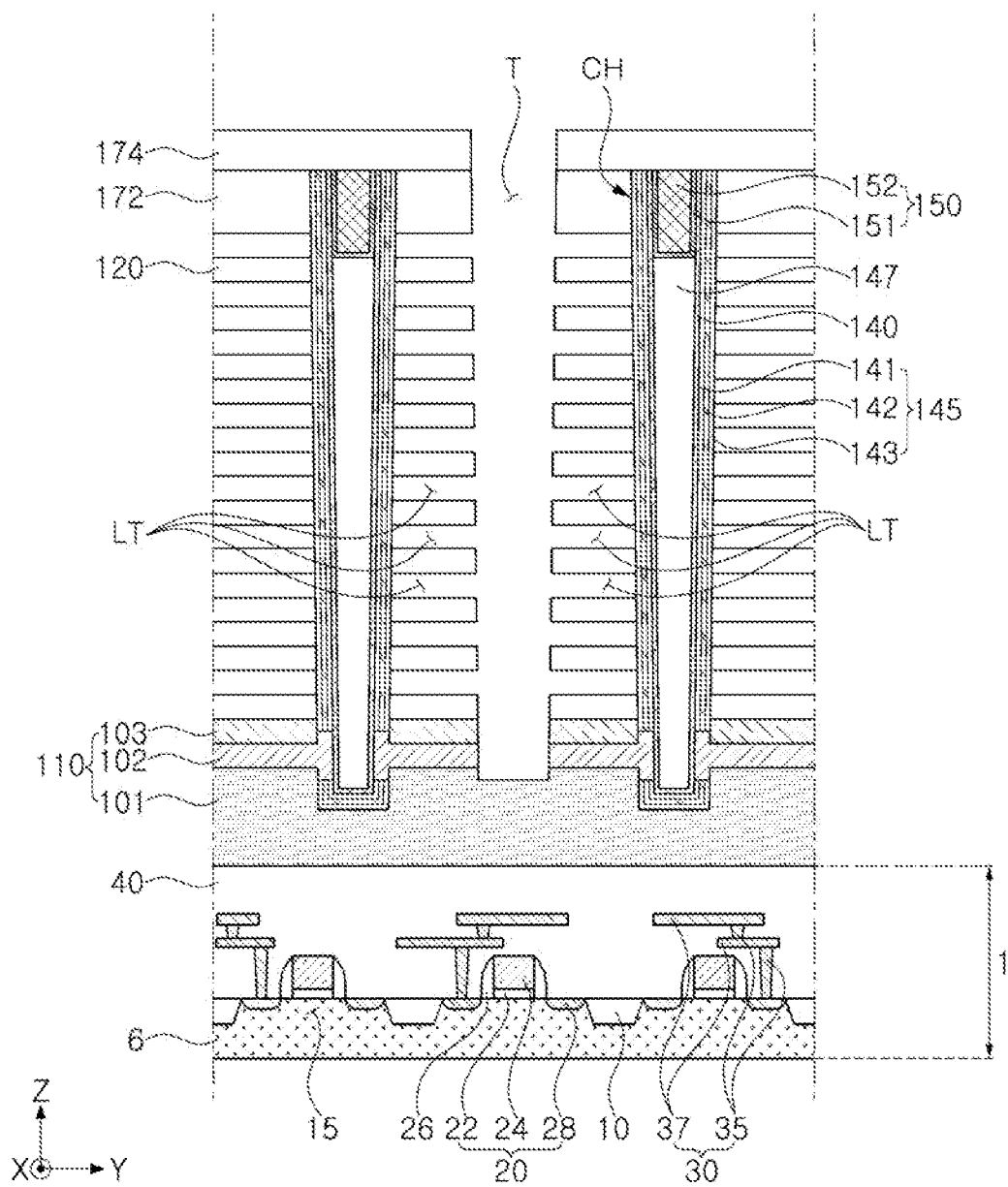

Referring to FIG. 18, the sacrificial layers 128 may be removed through the trench T, thereby forming horizontal openings LT.

The sacrificial layers 128 may be selectively removed with respect to the interlayer insulating layers 120, the upper capping layer 172, and the first upper insulating layer 174 through the isolation trench T. Accordingly, a plurality of horizontal openings LT may be formed between the interlayer insulating layers 120.

Referring again to FIG. 2, the gate electrodes 130 may be formed by filling the horizontal openings LT with a conductive material. Accordingly, the stack structure ST in which the interlayer insulating layers 120 and the gate electrodes 130 are alternately stacked may be formed. The forming the gate electrodes 130 may include forming the first gate layer 130a and the second gate layer 130b in order. Thereafter, the separation structure SS may be formed by filling the isolation trench T with an insulating material, and the second upper insulating layer 176, the contact plugs 181 and 185, and the bit line 190 may be formed. Accordingly, the semiconductor device 100 in FIGS. 2 and 3 may be manufactured.

Figure 19:
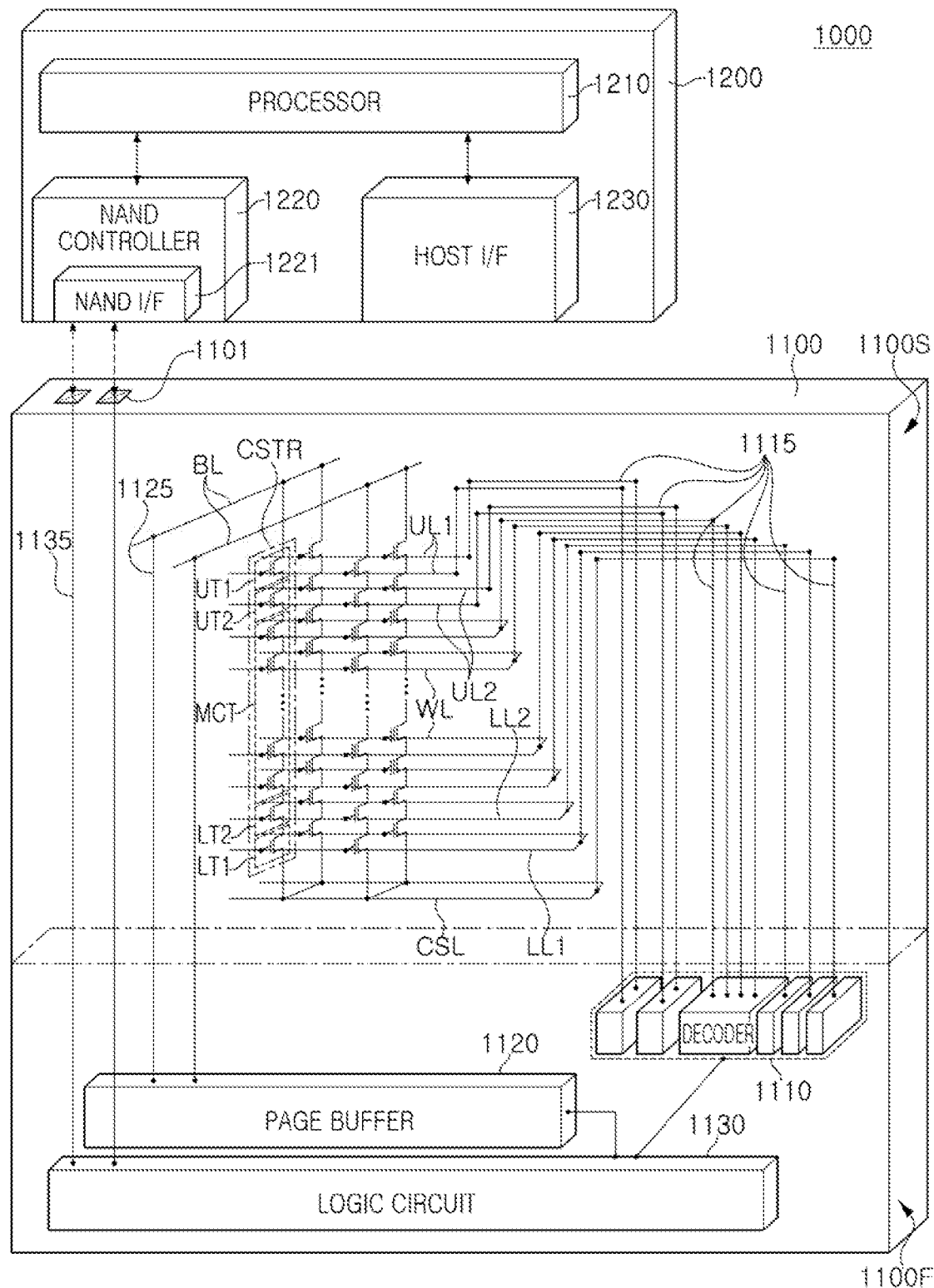
FIG. 19 is a view illustrating a data storage system including a semiconductor device according to an example embodiment.

FIG. 19 is a view illustrating a data storage system including a semiconductor device according to an example embodiment.

Referring to FIG. 19, a data storage system 1000 may include a semiconductor device 1100 and a controller 1200 electrically connected to the semiconductor device 1100. The data storage system 1000 may be implemented as a storage device including one or a plurality of semiconductor devices 1100 or an electronic device including a storage device. For example, the data storage system 1000 may be implemented as a solid state drive (SSD) device, a universal serial bus (USB), a computing system, a medical device, or a communication device, including one or a plurality of semiconductor devices 1100.

The semiconductor device 1100 may be implemented as a nonvolatile memory device, and may be implemented as the NAND flash memory device described with reference to FIGS. 1 to 12, for example. The semiconductor device 1100 may include a first semiconductor structure 1100F and a second semiconductor structure 1100S on the first semiconductor structure 1100F. In example embodiments, the first semiconductor structure 1100F may be disposed on the side of the second semiconductor structure 1100S. The first semiconductor structure 1100F may be configured as a peripheral circuit structure including a decoder circuit 1110, a page buffer 1120, and a logic circuit 1130. The second semiconductor structure 1100S may be configured as a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from the first semiconductor structure 1100F to the second semiconductor structure 1100S. The bit lines BL may be electrically connected to the page buffer 1120 through second connection interconnections 1125 extending from the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input and output pad 1101 electrically connected to the logic circuit 1130. The input and output pad 1101 may be electrically connected to the logic circuit 1130 through an input and output connection interconnection 1135 extending from the first semiconductor structure 1100F to the second semiconductor structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1100.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. Control commands for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 20:
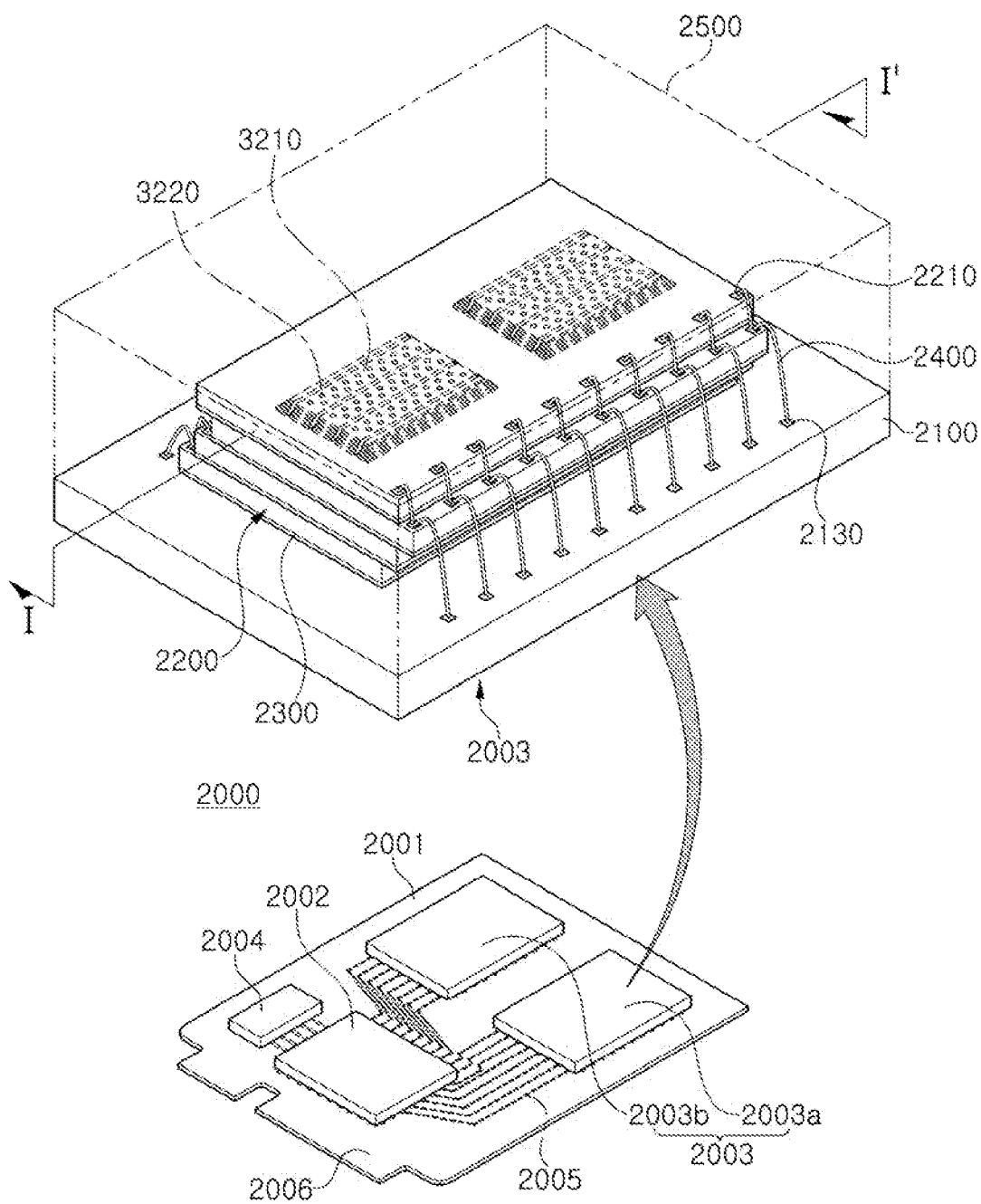
FIG. 20 is a perspective view illustrating a data storage system including a semiconductor device according to an example embodiment.

FIG. 20 is a perspective view illustrating a data storage system including a semiconductor device according to an example embodiment.

Referring to FIG. 20, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and the arrangement of the plurality of pins in the connector 2006 may be varied depending on a communication interface between the data storage system 2000 and the external host. In example embodiments, the data storage system 2000 may communication with the external host through one of a universal serial bus (USB), a peripheral component interconnect express (PCI-Express), a serial advanced technology attachment (SATA), and an M-phy for universal flash storage (UFS). In example embodiments, the data storage system 2000 may operate by power supplied from the external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operating speed of the data storage system 2000.

The DRAM 2004 may be configured as a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 further may include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each of the semiconductor chips 2200 may include an input and output pad 2210. The input and output pad 2210 may correspond to the input and output pad 1101 in FIG. 21. Each of the semiconductor chips 2200 may include gate stack structures 3210 and channel structures 3220. Each of the semiconductor chips 2200 may include the semiconductor device described with reference to FIGS. 1 to 12.

In example embodiments, the connection structure 2400 may be a bonding wire electrically connecting the input and output pad 2210 to the package upper pads 2130. Accordingly, in each of the first and second semiconductor packages 2003a and 2003b, the semiconductor chips 2200 may be electrically connected to each other through a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure including a through silicon via (TSV), instead of the connection structure 2400 of a bonding wire method.

In example embodiments, the controller 2002 and the semiconductor chips 2200 may be included in a single package. For example, the controller 2002 and the semiconductor chips 2200 may be mounted on a separate interposer substrate different from the main substrate 2001, and the controller 2002 may be connected to the semiconductor chips 2200 by interconnections formed on the interposer substrate.

Figure 21:
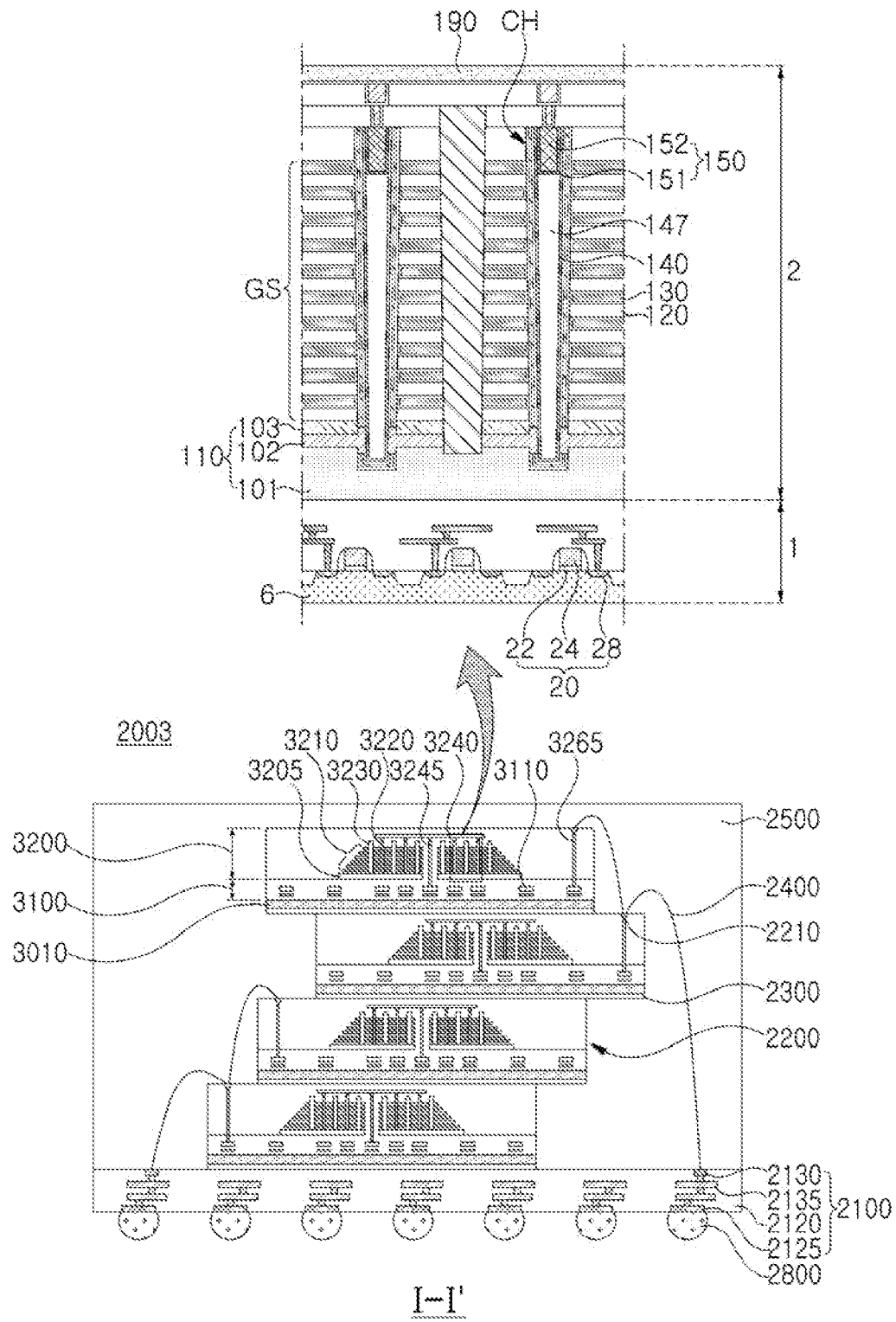
FIG. 21 is a cross-sectional view illustrating a semiconductor package according to an example embodiment.

FIG. 21 is a cross-sectional view illustrating a semiconductor device according to an example embodiment. FIG. 21 illustrates an example embodiment of the semiconductor package 2003 in FIG. 20, and illustrates the semiconductor package 2003 in FIG. 20 taken along line I-I'.

Referring to FIG. 21, in the semiconductor package 2003, the package substrate 2100 may be configured as a printed circuit board. The package substrate 2100 may include a package substrate body portion 2120, package upper pads 2130 (see FIG. 20) disposed on an upper surface of the package substrate body portion 2120, lower pads 2125 disposed on a lower surface of the package substrate body portion 2120 or exposed through the lower surface, and internal interconnections 2135 electrically connecting the package upper pads 2130 to the lower pads 2125 in the package substrate body portion 2120. The package upper pads 2130 may be electrically connected to the connection structures 2400. The lower pads 2125 may be connected to the interconnection patterns 2005 of the main substrate 2010 of the data storage system 2000 through conductive connection portions 2800 as in FIG. 20.

Each of the semiconductor chips 2200 may include a semiconductor substrate 3010 and a first structure 3100 and a second structure 3200 stacked in order on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 and separation structures 3230 penetrating the gate stack structure 3210, bit lines 3240 electrically connected to the channel structures 3220, which may be memory channel structures, and gate contact plugs 3235 electrically connected to the word lines WL (see FIG. 19) of the gate stack structure 3210. As described with reference to FIGS. 1 to 12, each of the semiconductor chips 2200 may include the semiconductor substrate 6, the circuit devices 20, the pattern structure 110, the stacked structure GS including the gate electrodes 130, the channel structures CH, and the bit line 190. Each of the channel structures CH may include a channel pad 150, and the channel pad 150 may include a first pad layer 151 and a second pad layer 152.

Each of the semiconductor chips 2200 may include a through interconnection 3245 electrically connected to the peripheral interconnections 3110 of the first structure 3100 and extending into the second structure 3200. The through interconnection 3245 may be disposed on an external side of the gate stack structure 3210, and may be further disposed to penetrate the gate stack structure 3210. Each of the semiconductor chips 2200 may further include an input and output pad 2210 (see FIG. 19) electrically connected to the peripheral interconnections 3110 of the first structure 3100.

According to the aforementioned example embodiments, a channel pad electrically connected to the bit line may include a first pad layer and a second pad layer in contact with the channel layer. The first pad layer may be formed of undoped polysilicon, and may include a region having a low impurity concentration due to impurities diffused from the second pad layer, and the second pad layer may include doped polysilicon having a high impurity concentration. Accordingly, a depletion region may be formed adjacent to the interfacial surface between the first pad layer and the channel layer, and the depletion region may overlap the erase control gate electrode in the horizontal direction. Accordingly, a GIDL current in which transverse BTBT dominates may be generated, and the GIDL generation area may increase by the area of the depletion region overlapping the erase control gate electrode, such that holes may be smoothly supplied into the channel layer during the erase operation. Accordingly, GIDL current generation efficiency may improve, such that a semiconductor device having improved electrical properties and a data storage system including the same may be provided.

Also, by optimizing the thickness and/or shape of the first pad layer, generation of GIDL current in the depletion region may increase during the erase operation, and an ion implantation process may be omitted, thereby reducing process costs. Accordingly, a semiconductor device having improved productivity and a data storage system including the same may be provided.

An example embodiment may provide a semiconductor device having improved electrical properties by improving efficiency of GIDL current generation and having improved productivity by lowering process costs.

An example embodiment may provide a data storage system including a semiconductor device having improved electrical properties by improving efficiency of GIDL current generation and having improved productivity by lowering process costs Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a lower structure including a semiconductor substrate and circuit devices on the semiconductor substrate;
    a pattern structure disposed on the lower structure and including a lower pattern layer, an intermediate pattern layer on the lower pattern layer, and an upper pattern layer on the intermediate pattern layer;
    a stack structure including interlayer insulating layers and gate electrodes alternately stacked on the pattern structure in a vertical direction;
    a channel structure penetrating the stack structure and extending in the vertical direction; and
    a separation structure penetrating the stack structure in the vertical direction, separating the gate electrodes of the stack structure from each other, and extending in a first direction perpendicular to the vertical direction,
    wherein:
    the channel structure includes a core insulating layer, a channel layer on a side surface of the core insulating layer, a gate dielectric layer extending to a region between the channel layer and the gate electrodes, and a channel pad in contact with the channel layer on the core insulating layer,
    a portion of the channel pad overlaps an uppermost gate electrode among the gate electrodes in a horizontal direction,
    the channel pad includes a first pad layer and a second pad layer on the first pad layer,
    the first pad layer covers at least a side surface of the second pad layer, and is in contact with the channel layer,
    the second pad layer includes doped polysilicon that is doped with impurities and having N-type conductivity, and
    the first pad layer includes at least one of an undoped polysilicon region and a doped polysilicon region having N-type conductivity and having an impurity concentration lower than an impurity concentration of the second pad layer.

2. The semiconductor device as claimed in claim 1, wherein:
    the doped polysilicon region of the first pad layer is in contact with the second pad layer,
    the first pad layer includes an overlap region overlapping the uppermost gate electrode in the horizontal direction, and
    a depletion region is formed in the overlap region adjacent to the channel layer.

3. The semiconductor device as claimed in claim 2, wherein the depletion region induces a gate induced drain leakage current during an erase operation of the semiconductor device to form electron-hole pairs.

4. The semiconductor device as claimed in claim 2, wherein:
    the overlap region includes a region having an impurity concentration of less than about $2\times10^{19}/cm^3$, and
    the depletion region is formed in the overlap region.

5. The semiconductor device as claimed in claim 1, wherein:
    the first pad layer has a first thickness in the horizontal direction in a region in contact with an internal side surface of the channel layer, and
    the first thickness is in a range of about 3 nm to about 10 nm.

6. The semiconductor device as claimed in claim 1, wherein:
    the first pad layer has a first thickness in the horizontal direction in a region in contact with an internal side surface of the channel layer, and
    the first thickness is in a range of about 5 nm to about 9 nm.

7. The semiconductor device as claimed in claim 1, wherein the first pad layer is in contact with the side surface and a lower surface of the second pad layer.

8. The semiconductor device as claimed in claim 1, wherein:
    the first pad layer has a first side surface in contact with the channel layer, and a second side surface in contact with the second pad layer, and
    a slope of the first side surface is different from a slope of the second side surface.

9. The semiconductor device as claimed in claim 8, wherein the first pad layer includes a portion of which a thickness taken in the horizontal direction decreases toward an upper end in a region in contact with an internal side surface of the channel layer.

10. The semiconductor device as claimed in claim 8, wherein a bottom surface of the second pad layer is in contact with an upper surface of the core insulating layer.

11. The semiconductor device as claimed in claim 8, wherein the second pad layer is in contact with the first pad layer below the side surface, and is in contact with the channel layer above the side surface.

12. The semiconductor device as claimed in claim 1, wherein a surface of the first pad layer in contact with the second pad layer has a serration portion.

13. The semiconductor device as claimed in claim 1, wherein:
    the lower pattern layer includes polysilicon including impurities having N-type conductivity,
    the intermediate pattern layer extends along an upper surface of the lower pattern layer, penetrates the gate dielectric layer, and is in contact with the channel layer, and
    a level of an upper surface of the separation structure is higher than a level of an upper surface of the channel structure with respect to a surface of the lower pattern layer facing the stack structure.

14. A semiconductor device, comprising:
    a pattern structure including a lower pattern layer, an intermediate pattern layer on the lower pattern layer, and an upper pattern layer on the intermediate pattern layer;

a stack structure including interlayer insulating layers and gate electrodes alternately stacked on the pattern structure in a vertical direction; and a channel structure penetrating the stack structure and extending in the vertical direction, wherein:

the channel structure includes a core insulating layer, a channel layer on a side surface of the core insulating layer, a gate dielectric layer extending to a region between the channel layer and the gate electrodes, and a channel pad in contact with the channel layer on the core insulating layer, a bottom surface of the channel pad is disposed at a level that is lower than a level of an upper surface of an uppermost gate electrode among the gate electrodes, the channel pad includes a first pad layer and a second pad layer on the first pad layer, an internal side surface of the first pad layer in contact with the second pad layer is inclined with respect to an external side surface of the first pad layer in contact with the channel layer at a level of a region overlapping at least the uppermost gate electrode in a horizontal direction, the second pad layer includes doped polysilicon having N-type conductivity, and the first pad layer includes a doped polysilicon region having N-type conductivity and having an impurity concentration lower than an impurity concentration of the second pad layer.

15. The semiconductor device as claimed in claim 14, wherein the internal side surface of the first pad layer has a slope that is less steep than a slope of the external side surface.

16. The semiconductor device as claimed in claim 14, wherein:

the first pad layer includes a lower portion and an upper portion on the lower portion in a region in contact with the internal side surface of the channel layer, the lower portion has a first thickness in the horizontal direction, and the upper portion has a second thickness less than the first thickness in the horizontal direction.

17. The semiconductor device as claimed in claim 14, wherein:

the first pad layer further includes an undoped polysilicon region, the undoped polysilicon region is in contact with the channel layer, and the doped polysilicon region of the first pad layer is in contact with the second pad layer.

18. The semiconductor device as claimed in claim 17, wherein:

the first pad layer includes an overlap region overlapping the uppermost gate electrode in the horizontal direction in a region adjacent to the channel layer, the overlap region has an impurity concentration lower than an impurity concentration of the second pad layer, and a depletion region is formed in the overlap region adjacent to the channel layer.

19. A data storage system, comprising:

a semiconductor storage device including a lower structure including a semiconductor substrate and circuit devices on the semiconductor substrate, an upper structure on the lower structure, and an input/output pad electrically connected to the circuit devices; and a controller electrically connected to the semiconductor storage device through the input/output pad and controlling the semiconductor storage device, wherein:

the upper structure includes:

a pattern structure disposed on the lower structure and including a lower pattern layer, an intermediate pattern layer on the lower pattern layer, and an upper pattern layer on the intermediate pattern layer, a stack structure including interlayer insulating layers and gate electrodes alternately stacked on the pattern structure in a vertical direction; and a channel structure penetrating the stack structure and extending in the vertical direction, the channel structure includes a core insulating layer, a channel layer on a side surface of the core insulating layer, a gate dielectric layer extending to a region between the channel layer and the gate electrodes, and a channel pad in contact with the channel layer on the core insulating layer, a portion of the channel pad overlaps an uppermost gate electrode among the gate electrodes in a horizontal direction, the channel pad includes a first pad layer and a second pad layer on the first pad layer, the first pad layer covers both side surfaces of the second pad layer opposing each other, the first pad layer has a first side surface in contact with the channel layer and a second side surface in contact with the second pad layer, a slope of the first side surface is different from a slope of the second side surface, the second pad layer includes polysilicon doped with impurities having N-type conductivity, and the first pad layer includes a polysilicon region having N-type conductivity and having an impurity concentration lower than an impurity concentration of the second pad layer.

20. The data storage system as claimed in claim 19, wherein:

the polysilicon region of the first pad layer is in contact with the second pad layer, the first pad layer includes an overlap region overlapping the uppermost gate electrode in the horizontal direction, and a depletion region is formed in the overlap region adjacent to the channel layer.

\* \* \* \* \*